United States Patent
Nagaosa et al.

(10) Patent No.: US 9,824,712 B2
(45) Date of Patent: Nov. 21, 2017

(54) MAGNETIC STORAGE MEDIA AND DATA STORAGE DEVICE

(71) Applicant: RIKEN, Saitama (JP)

(72) Inventors: Naoto Nagaosa, Tokyo (JP); Wataru Koshibae, Saitama (JP); Junichi Iwasaki, Tokyo (JP); Masashi Kawasaki, Tokyo (JP); Yoshinori Tokura, Tokyo (JP); Yoshio Kaneko, Chiba (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/423,600

(22) Filed: Feb. 3, 2017

(65) Prior Publication Data

US 2017/0206921 A1    Jul. 20, 2017

Related U.S. Application Data

(63) Continuation of application No. PCT/JP2015/069339, filed on Jul. 3, 2015.

(30) Foreign Application Priority Data

Aug. 7, 2014 (JP) ................. 2014-161888

(51) Int. Cl.
    *G11B 5/74* (2006.01)
    *G11B 5/02* (2006.01)
    *G11C 19/08* (2006.01)
    *G11B 5/00* (2006.01)

(52) U.S. Cl.
    CPC .............. *G11B 5/74* (2013.01); *G11B 5/02* (2013.01); *G11C 19/085* (2013.01); *G11C 19/0808* (2013.01); *G11C 19/0858* (2013.01); *G11B 2005/0021* (2013.01)

(58) Field of Classification Search
    CPC .............. G11C 19/085; G11C 19/0808; G11C 19/0858
    USPC ........................................... 365/171
    See application file for complete search history.

(56) References Cited

FOREIGN PATENT DOCUMENTS

JP    2006-221712 A    8/2006

OTHER PUBLICATIONS

"Correction for Yu Et Al., Magnetic Stripes and Skyrmions with Helicity Reversals." Proceedings of the National Academy of Sciences 114.2 (2017).*

(Continued)

*Primary Examiner* — Hoai V Ho
*Assistant Examiner* — Jay Radke

(57) ABSTRACT

A magnetic storage media which has an endurance (durability) characteristics close to an infinite number of writing times of data and a data retention (holding) characteristics close to permanency, and is ultra-high-speed writable and erasable, and a data storage device and an image storage device which apply this magnetic storage media are provided. A magnetic storage media includes a thin layer magnet and a magnetic field generating unit arranged facing a surface of the magnet, and is capable of creating or eliminating a skyrmion by applying heat energy to another surface of the magnet positioned on the opposite side of the surface of the magnet, and a skyrmion memory includes the magnetic storage media.

15 Claims, 27 Drawing Sheets

(56) References Cited

OTHER PUBLICATIONS

Yu, X., M. Mostovoy, Y. Tokunaga, W. Zhang, K. Kimoto, Y. Matsui, Y. Kaneko, N. Nagaosa, and Y. Tokura. "Magnetic Stripes and Skyrmions with Helicity Reversals." Proceedings of the National Academy of Sciences 109.23 (2012): 8856-860.*

Yu, X. Z., N. Kanazawa, Y. Onose, K. Kimoto, W. Z. Zhang, S. Ishiwata, Y. Matsui, and Y. Tokura. "Near Room-temperature Formation of a Skyrmion Crystal in Thin-films of the Helimagnet FeGe." Nature Materials 10.2 (2010): 106-09.*

Savoini, M., M. Finazzi, A. R. Khorsand, A. Tsukamoto, A. Itoh, L. Duà², M. Ezawa, A. Kirilyuk, and Th. Rasing. "Laser-Induced Giant Skyrmions and Skyrmion-Compounds in a Thin Magnetic Film of TbFeCo." Springer Proceedings in Physics Ultrafast Magnetism I (2014): 106-09.*

Romming, N., C. Hanneken, M. Menzel, J. E. Bickel, B. Wolter, K. Von Bergmann, A. Kubetzka, and R. Wiesendanger. "Writing and Deleting Single Magnetic Skyrmions." Science 341.6146 (2013): 636-39.*

Ogasawara, T., N. Iwata, Y. Murakami, H. Okamoto, and Y. Tokura. "Submicron-scale Spatial Feature of Ultrafast Photoinduced Magnetization Reversal in TbFeCo Thin Film." Applied Physics Letters 94.16 (2009): 162507.*

Fert, Albert, Vincent Cros, and João Sampaio. "Skyrmions on the Track." Nature Nanotechnology 8.3 (2013): 152-56.*

Koshibae, Wataru, and Naoto Nagaosa. "Creation of Skyrmions and Antiskyrmions by Local Heating." Nature Communications 5 (2014): 5148.*

Han, Jung Hoon, Jiadong Zang, Zhihua Yang, Jin-Hong Park, and Naoto Nagaosa. "Skyrmion Lattice in a Two-dimensional Chiral Magnet." Physical Review B 82.9 (2010).*

Finazzi, M., M. Savoini, A. R. Khorsand, A. Tsukamoto, A. Itoh, L. Duà², A. Kirilyuk, Th. Rasing, and M. Ezawa. "Laser-Induced Magnetic Nanostructures with Tunable Topological Properties." Physical Review Letters 110.17 (2013).*

Lukas Novotony and Niek van Hulst, "Antennas for light" Nature Photonics Feb. 1, 2011 p. 83-90, vol. 5.

M. Lutwyche, et al., "5×5 2D AFM cantilever Arrays a first step toward a Terabit storage device", Sensors and Actuators, vol. 73, p. 89-94 (1999).

Naoto Nagaosa, Yoshinori Tokura, "Topological properties and dynamics of magnetic skyrmions", Nature Nanotechnology, United Kingdom, Nature Publishing Group, Dec. 4, 2013, vol. 8, p. 899-911.

* cited by examiner

US 9,824,712 B2

MAGNETIC STORAGE MEDIA AND DATA STORAGE DEVICE

The contents of the following Japanese patent applications are incorporated herein by reference:
NO. 2014-161888 filed in JP on Aug. 7, 2014, and
NO. PCT/JP2015/069339 filed on Jul. 3, 2015.

BACKGROUND

1. Technical Field

The present invention relates to a magnetic storage media which can create and eliminate a skyrmion by applying heat energy to a thin layer magnet, a data storage device which includes the magnetic storage media, a skyrmion memory, a skyrmion device, a data storage device which includes the skyrmion device, a data processing apparatus which includes the skyrmion device, and a data communication apparatus which includes the skyrmion device.

2. Related Art

DVD+RW is known as an example of device for storing data by applying heat energy. For the DVD+RW used in an image storage device, its memory capacity is drastically increased to a capacity of several tens of GB due to the appearance of the blue laser. The DVD+RW is rewritable and uses a phase change type storage media which is capable of corresponding to high-speed storage (Patent Document 1).

For a phase change type memory, when writing information, a material such as GeTe and the like is phase changed from a crystal phase to an amorphous phase by local heat and is quenched. In this way, a portion of the material is in the amorphous phase. A resistance change between a high resistance state of the crystal phase and a low resistance state of the amorphous phase is utilized as bit information. A transition time from the crystal phase to the amorphous phase is approximately several tens of nanoseconds (ns). The speed cannot be higher than the above. Also, when erasing information, in order to erase the amorphous portion in a short time, it is necessary to accelerate a crystallization speed of a memory layer. In order to accelerate the crystallization speed, there have been technical development problems such as that it is necessary to make the amorphous portion be further fined than the conventional one (Patent Document 1).

PRIOR ART DOCUMENTS

Patent Document

[Patent Document 1] Japanese Patent Application Publication No. 2006-221712

Non-Patent Document

[Non-Patent Document 1] Lukas Novotony and Niek van Hulst, "Antennas for light" Nature Photonics 5, 83-90 (2011).
[Non-Patent Document 2] M. Lutwyche, et al., "5×5 2D AFM cantilever Arrays a first step toward a Terabit storage device", Sensors and Actuators, Vol. 73, p. 89-94 (1999).
[Non-Patent Document 3] Naoto Nagaosa, Yoshinori Tokura, "Topological properties and dynamics of magnetic skyrmions", Nature Nanotechnology, United Kingdom, Nature Publishing Group, Dec. 4, 2013, Vol. 8, p. 899-911.

For achieving high-speed information storage, it is necessary to shorten the time required for information generation or erasure. Also, in order to improve the information storage density, it is necessary to reduce a storage bit size for carrying information from several nanometers to several tens of nanometers, as small as possible.

SUMMARY

According to a first aspect of the present invention, a magnetic storage media is provided, which includes a thin layer magnet and a magnetic field generating unit arranged facing a surface of the magnet, and is capable of creating or eliminating skyrmion by applying heat energy to another surface of the magnet positioned on an opposite side of the surface of the magnet. According to a second aspect of the present invention, a skyrmion memory is provided, which includes a thin layer magnet and a magnetic field generating unit arranged facing a surface of the magnet, includes a first electrode and a second electrode, the first electrode including an insulator arranged in contact with an upper portion of another surface of the magnet and a magnetic metal arranged in contact with an upper portion of the insulator, the second electrode including a metal arranged in contact with a lower portion of the surface in another surface of the magnet positioned on an opposite side of the surface of the magnet, applies a current pulse between the two electrodes, and is capable of creating or eliminating skyrmion by applying heat energy by Joule heat generated in the insulator.

It should be noted that the summary clause does not necessarily describe all necessary features of the embodiments of the present invention. The present invention may also be a sub-combination of the features described above.

Figure 11:
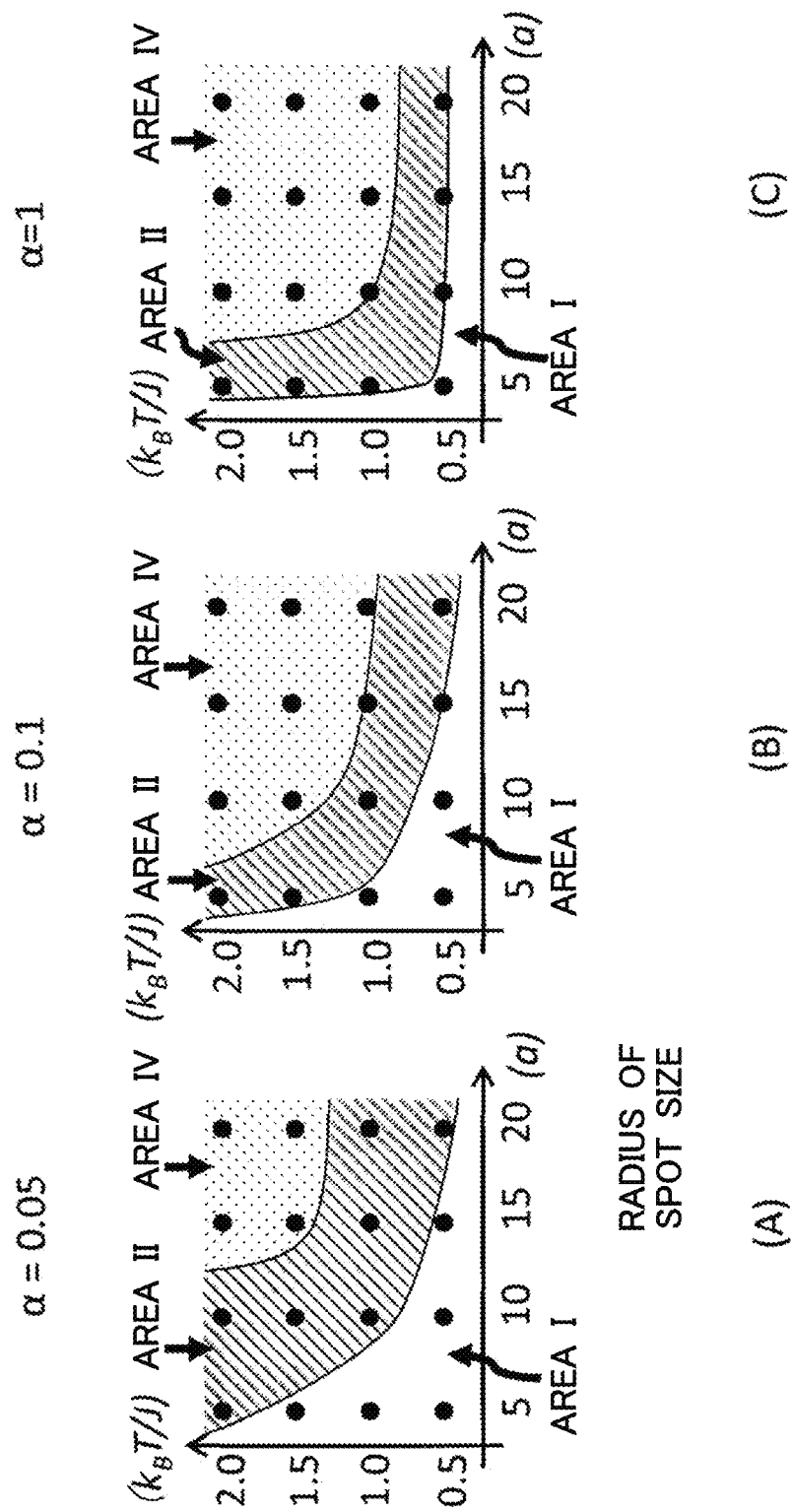
FIG. 11 is a drawing showing a dependence between local heat energy (vertical axis) and a radius of spot size of the local heat energy (horizontal axis) for types of the skyrmion which can be created, according to a fourth embodiment.
Figure 12:
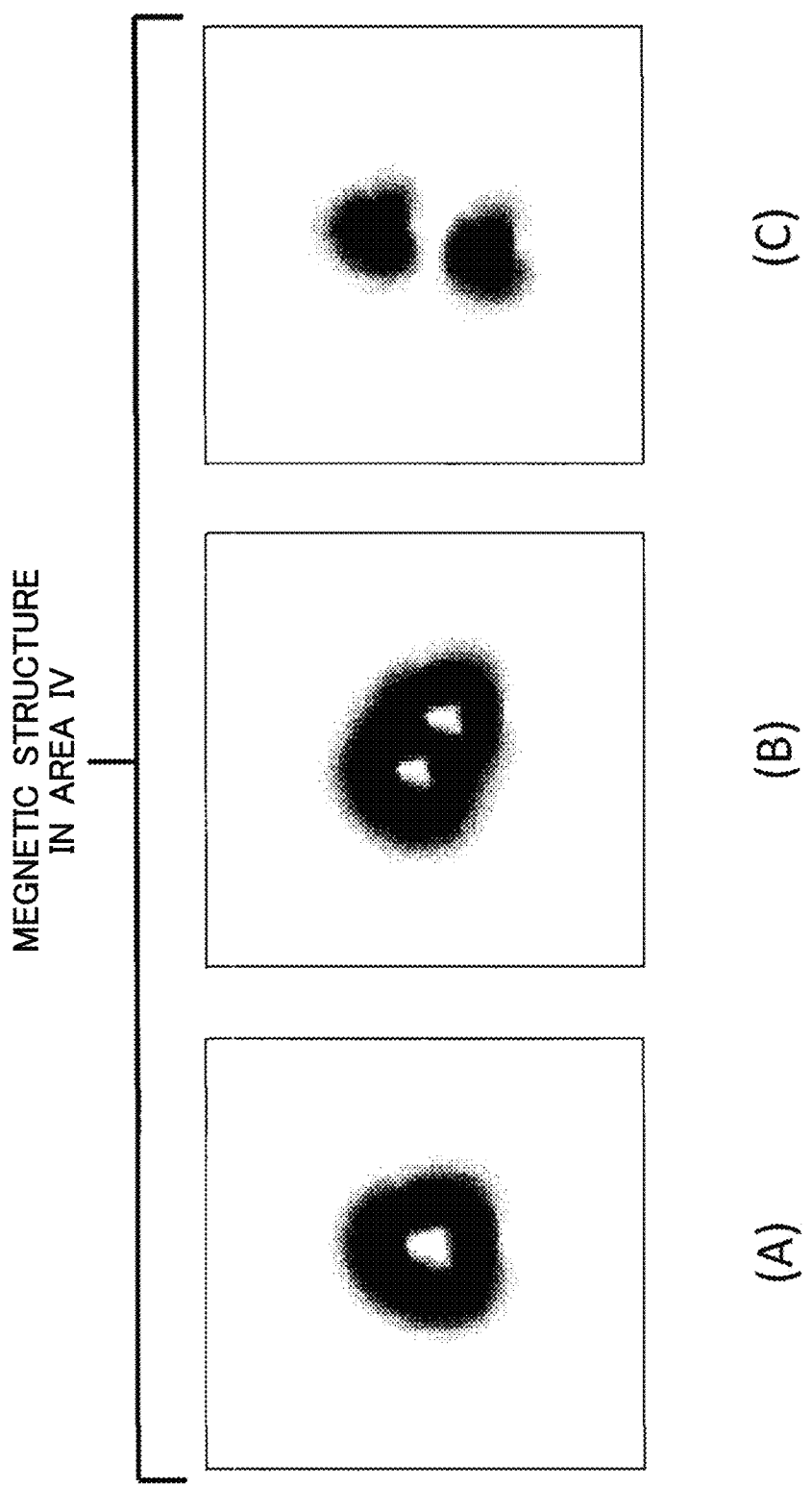

(A) and (B) of FIG. 12 are drawings showing the magnetic textures in area IV of FIG. 11, the magnetic textures different from a single skyrmion 40.

(C) of FIG. 12 is a drawing showing a magnetic texture in the area IV of FIG. 11, the magnetic texture with two skyrmions 40.

Figure 13:
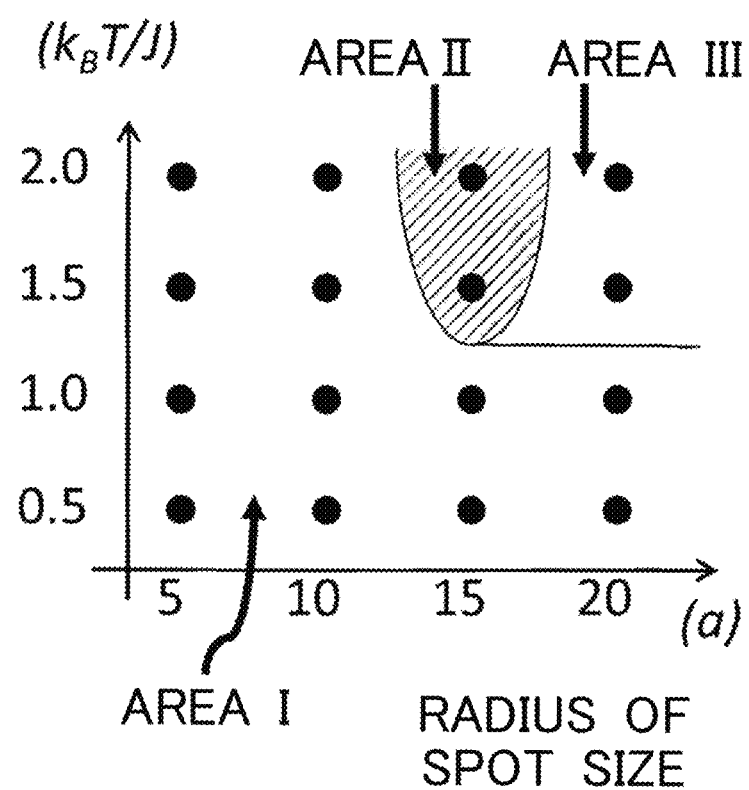

FIG. 13 is a drawing showing a dependence between local heat energy (vertical axis) and a radius of spot size of the local heat energy (horizontal axis) for the creation or the elimination of the skyrmion 40 according to a fifth embodiment.

Figure 14:
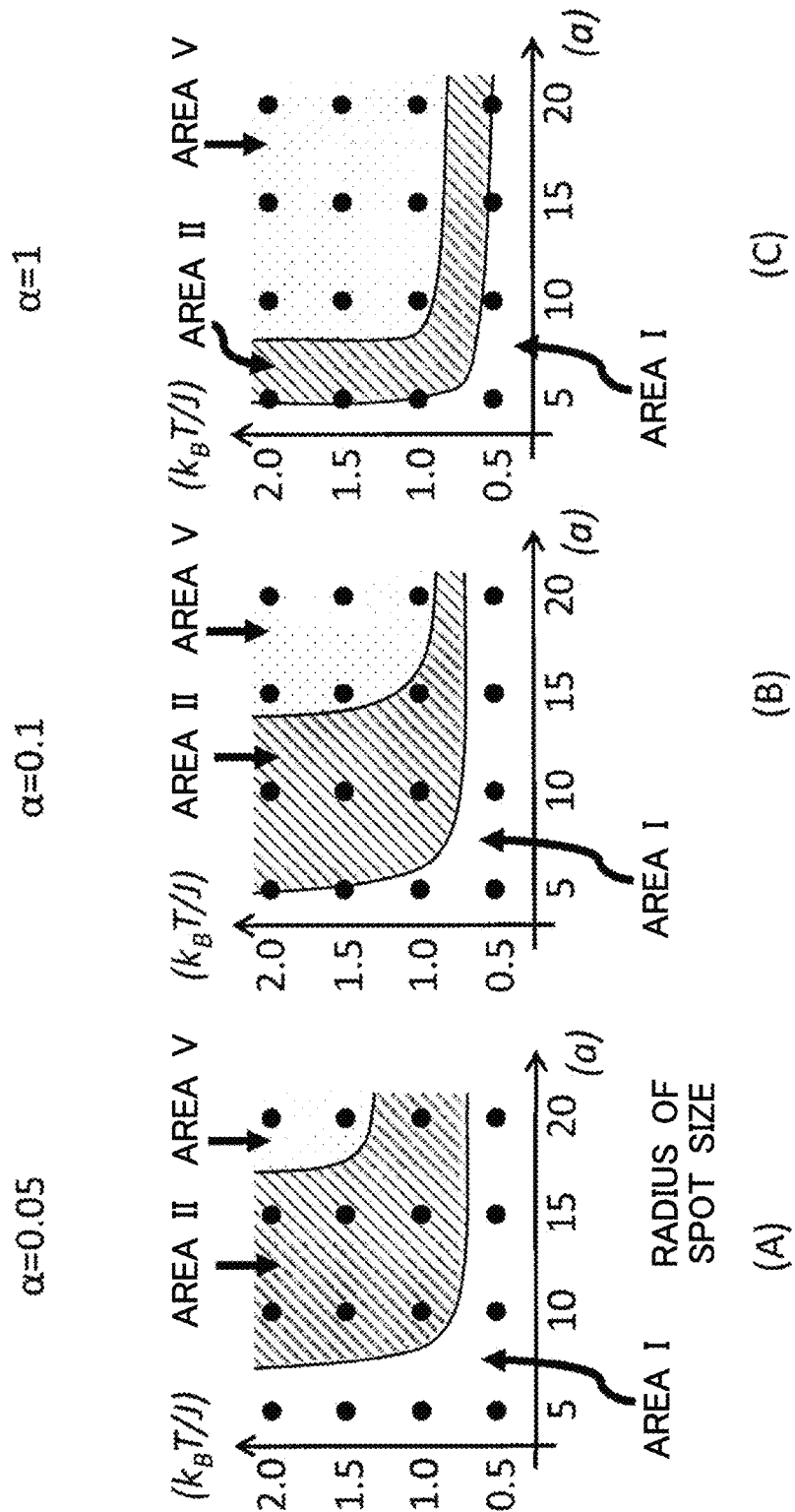

FIG. 14 is a drawing showing a dependence between local heat energy (vertical axis) and a radius of spot size of the local heat energy (horizontal axis) for the creation of the skyrmion 40 according to a sixth embodiment.

Figure 15:
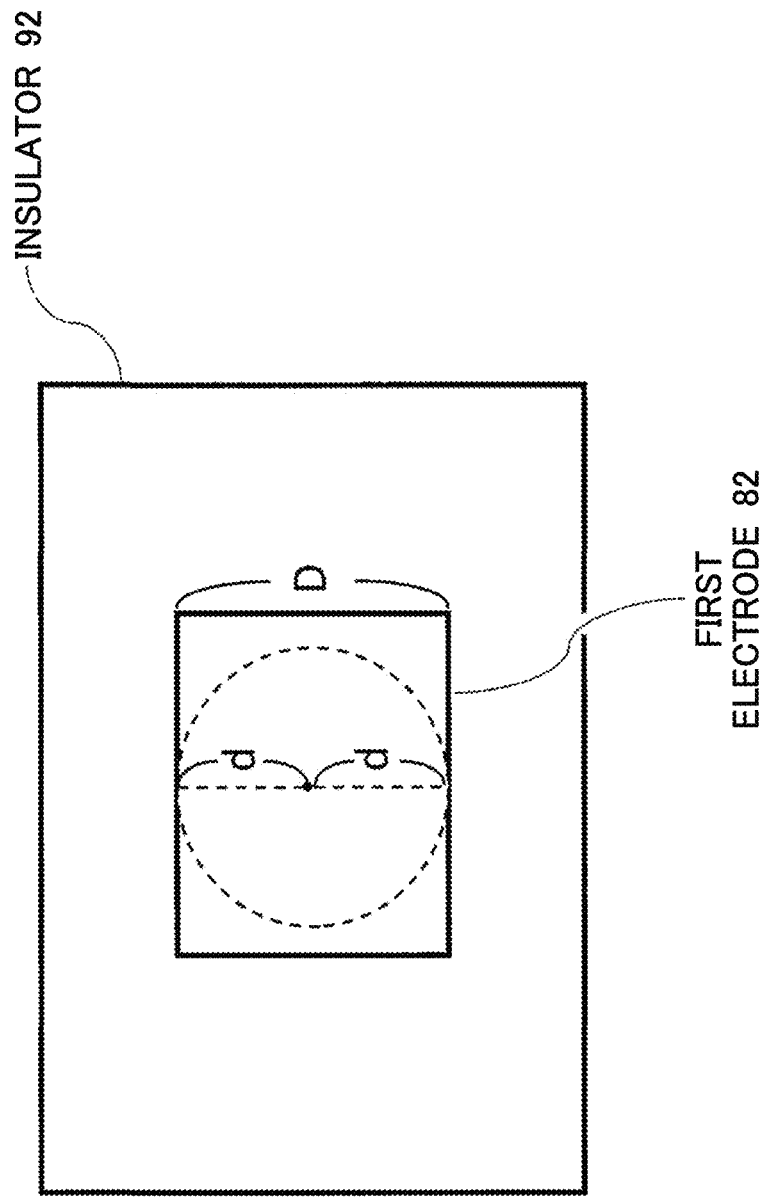
Figure 15:
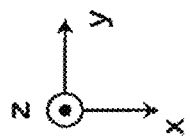

FIG. 15 is a drawing showing an example of shapes of a first electrode 82 in a case of viewing from an x-y plane.

Figure 16:
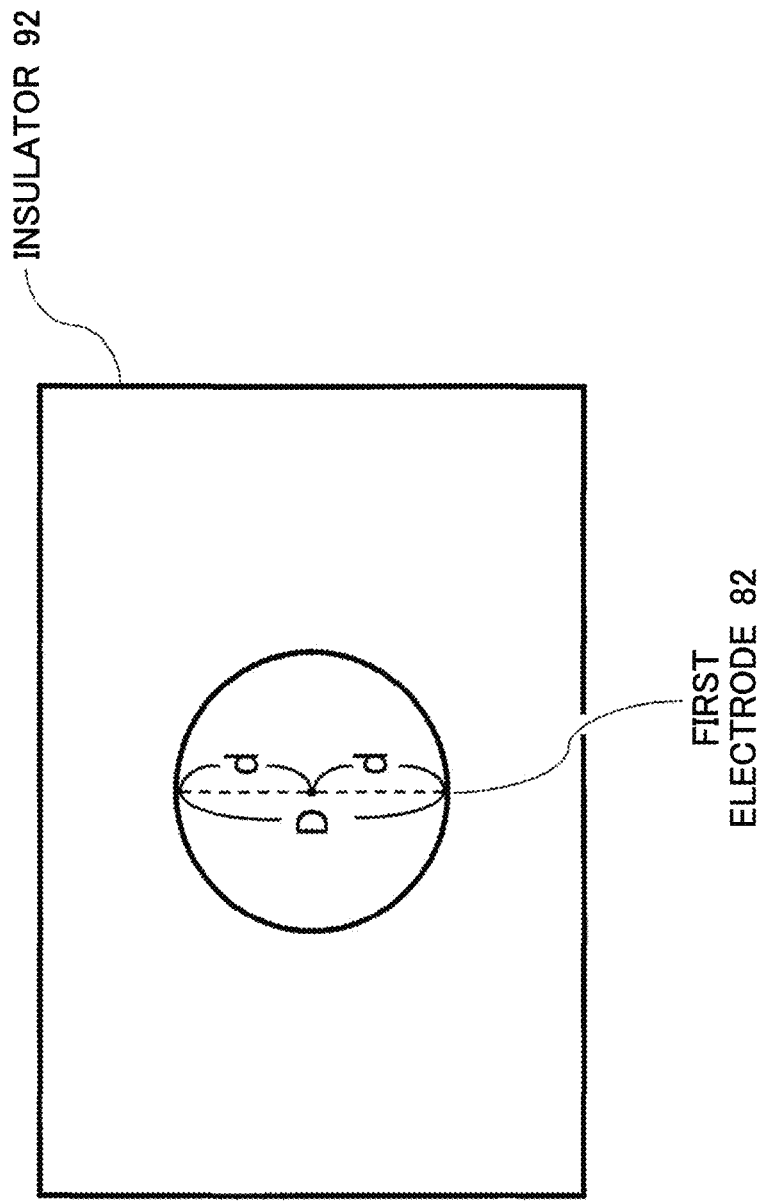

FIG. 16 is a drawing showing an example of shapes of the first electrode 82 in a case of viewing from the x-y plane.

Figure 17:
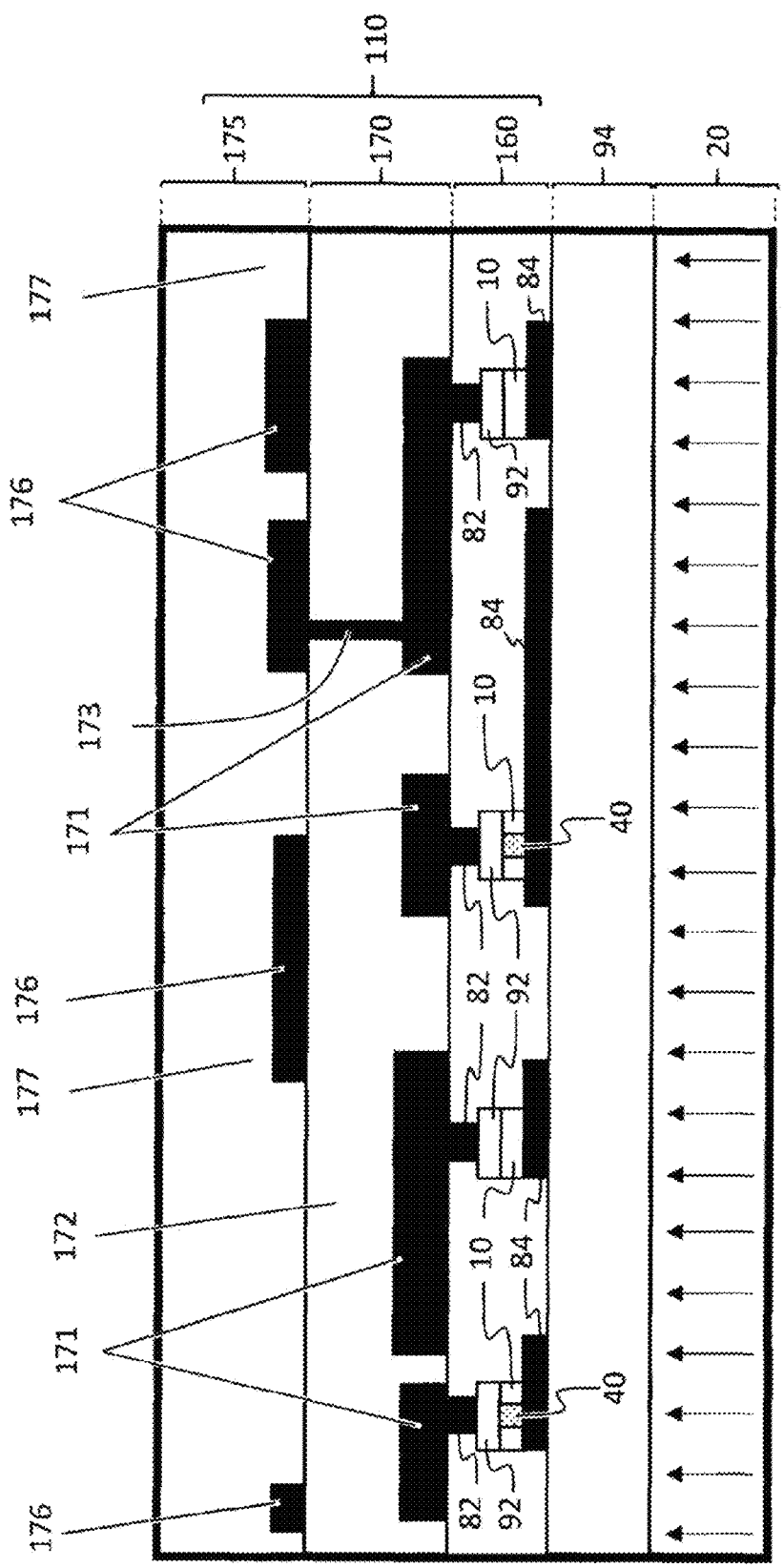

FIG. 17 is a drawing showing a cross section of a skyrmion memory device 500.

Figure 18:
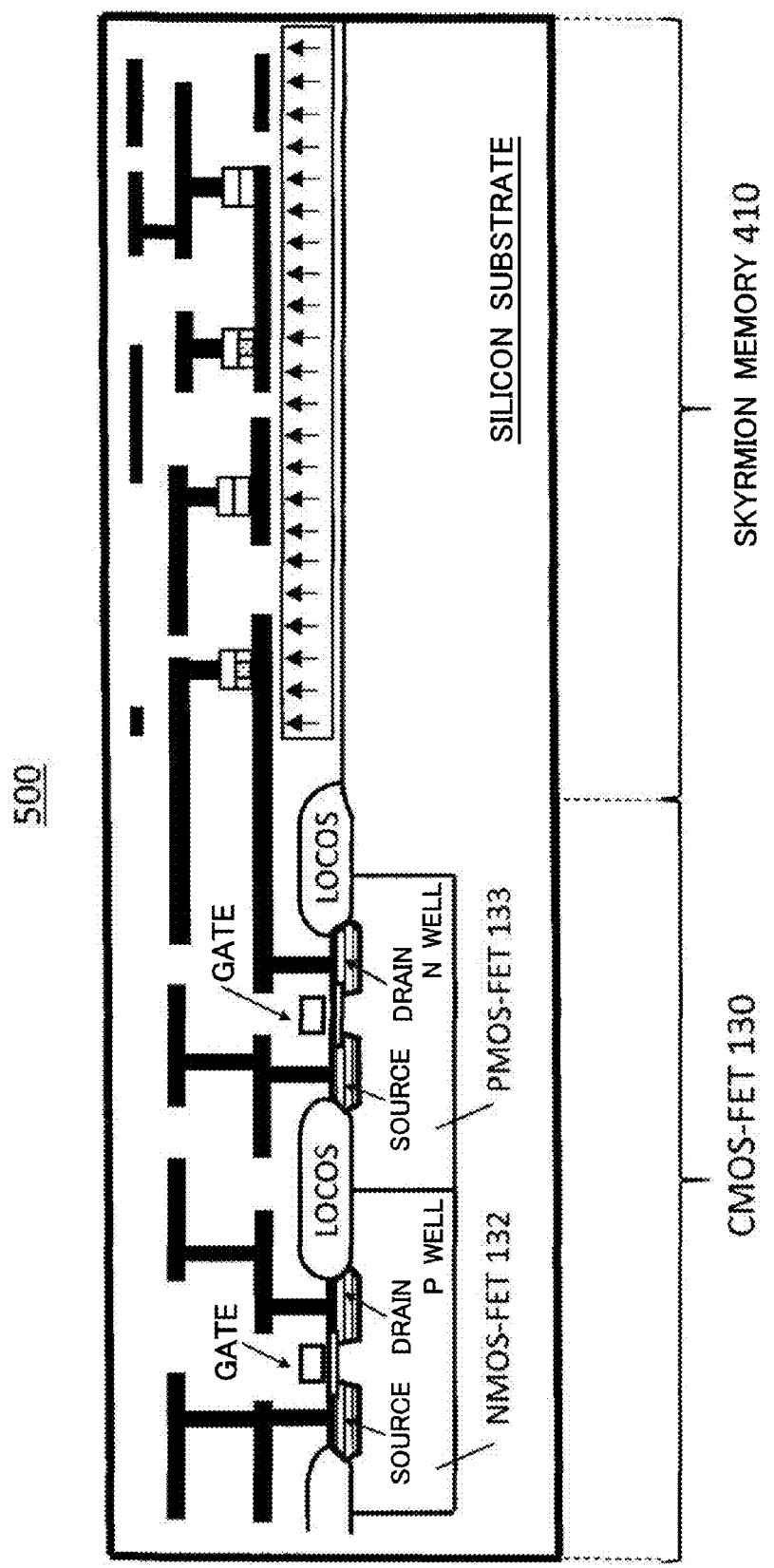

FIG. 18 is a drawing showing a cross section of the skyrmion memory device 500 embedding a skyrmion memory 410 and a CMOS-FET 130.

Figure 19:
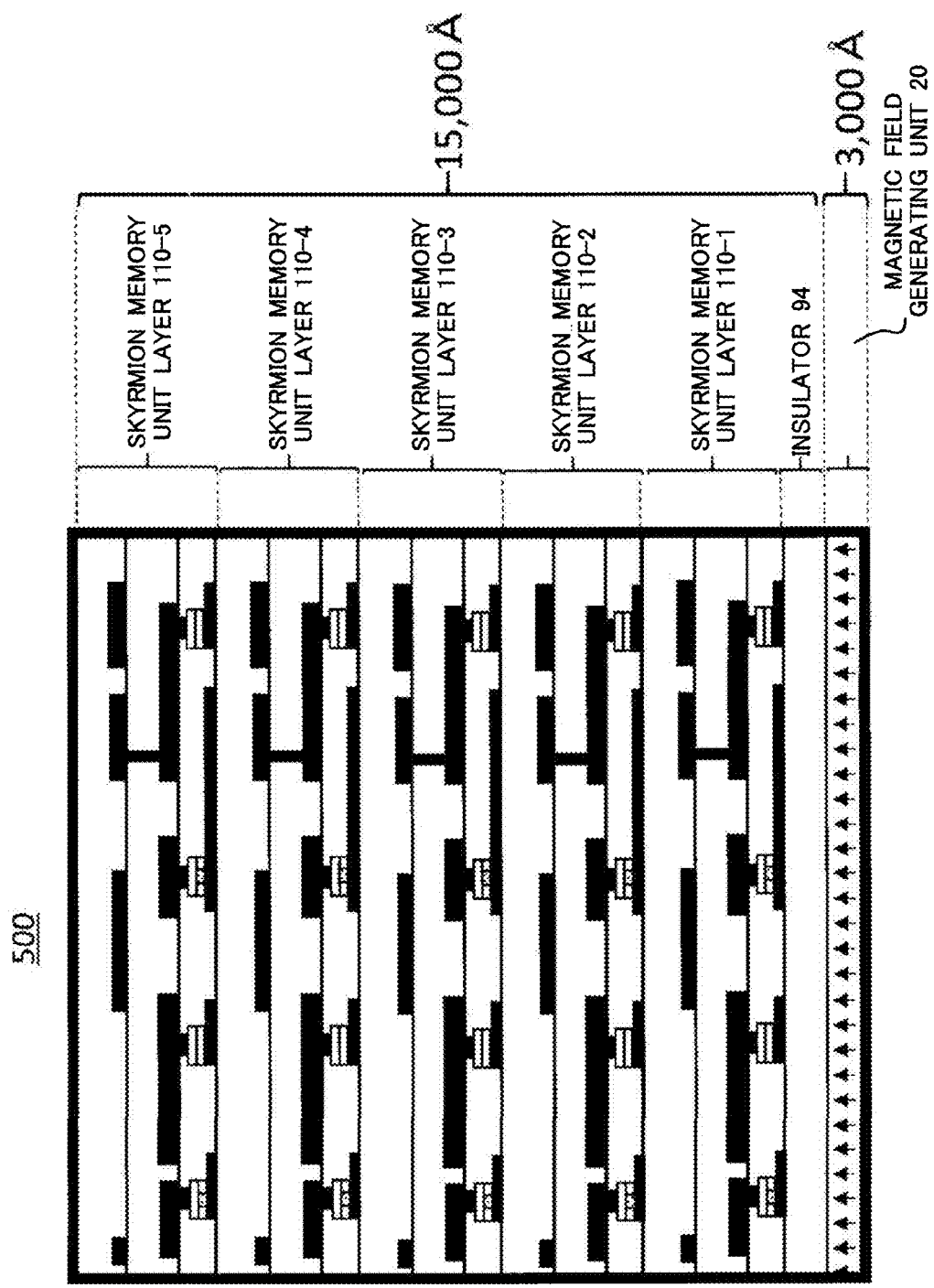

FIG. 19 is a drawing showing a cross section of the skyrmion memory device 500 laminating n layers of skyrmion memory unit layers 110.

Figure 20:
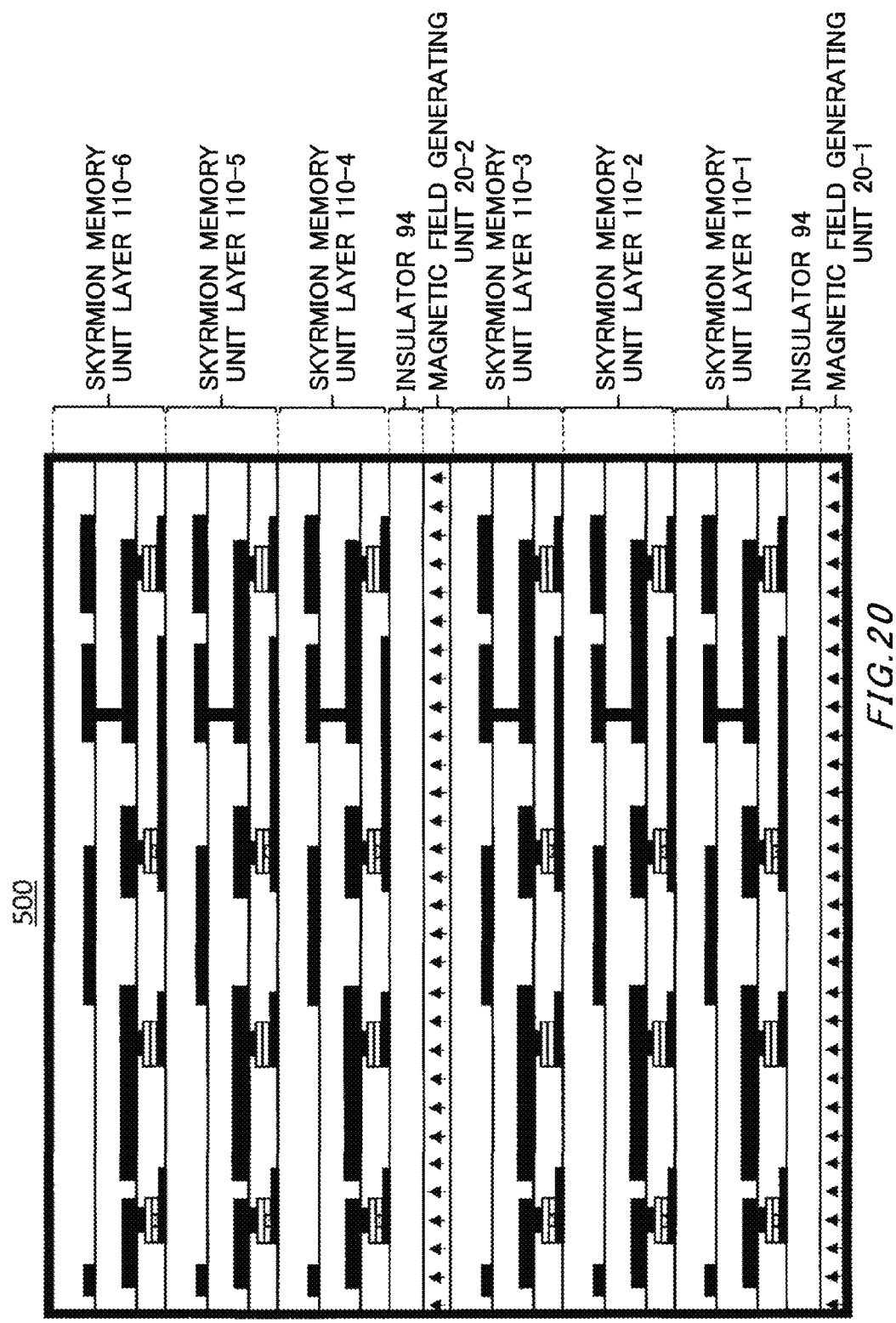

FIG. 20 is a drawing showing a cross section of the skyrmion memory device 500 having a plurality of magnetic field generating units 20.

Figure 21:
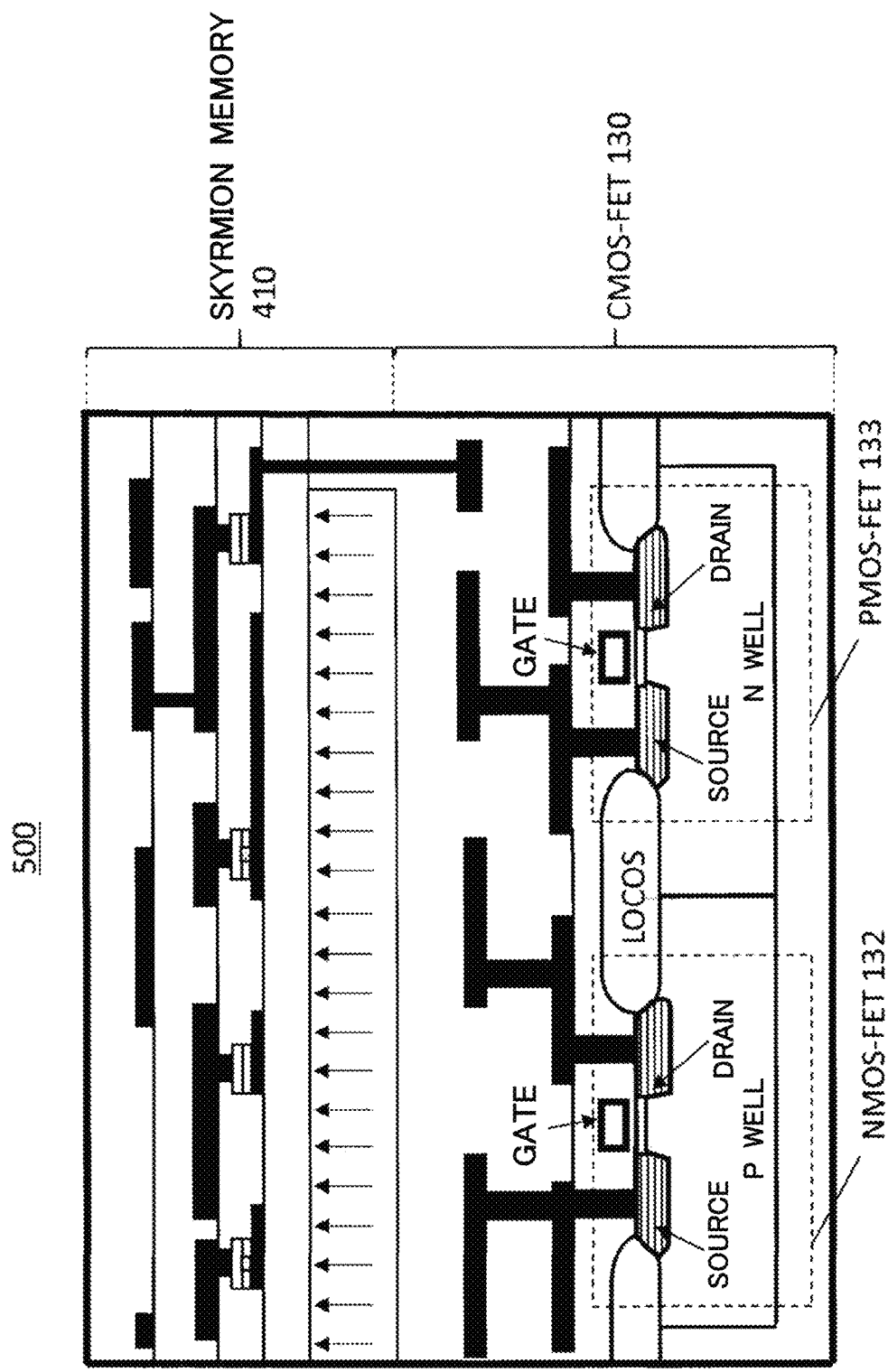

FIG. 21 is a drawing showing a cross section of the skyrmion memory device 500 embedding the skyrmion memory 410 on an upper layer of the CMOS-FET 130.

Figure 22:
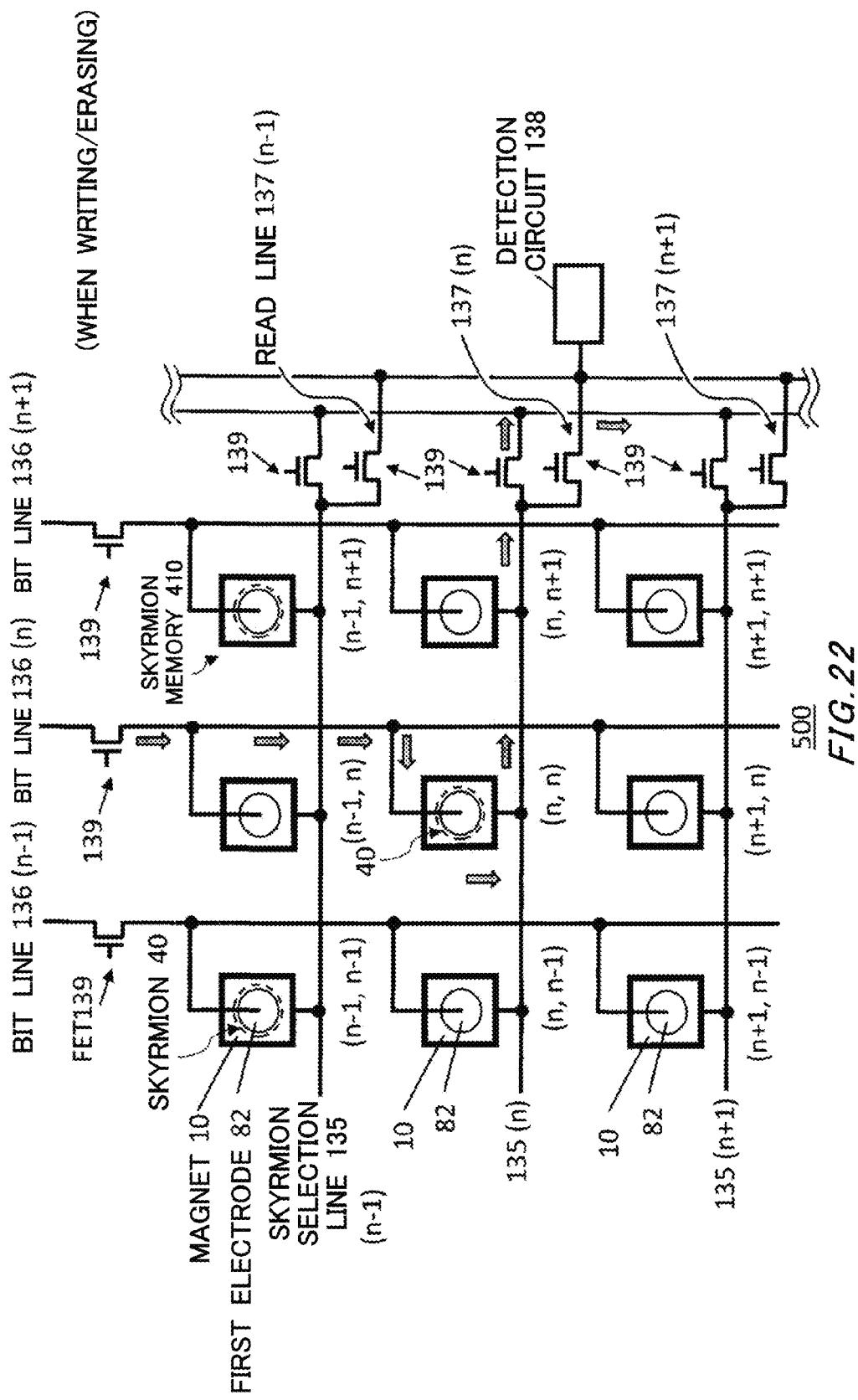

FIG. 22 is a drawing showing one example of a writing circuit and an erasure circuit of the skyrmion memory device 500.

Figure 23:
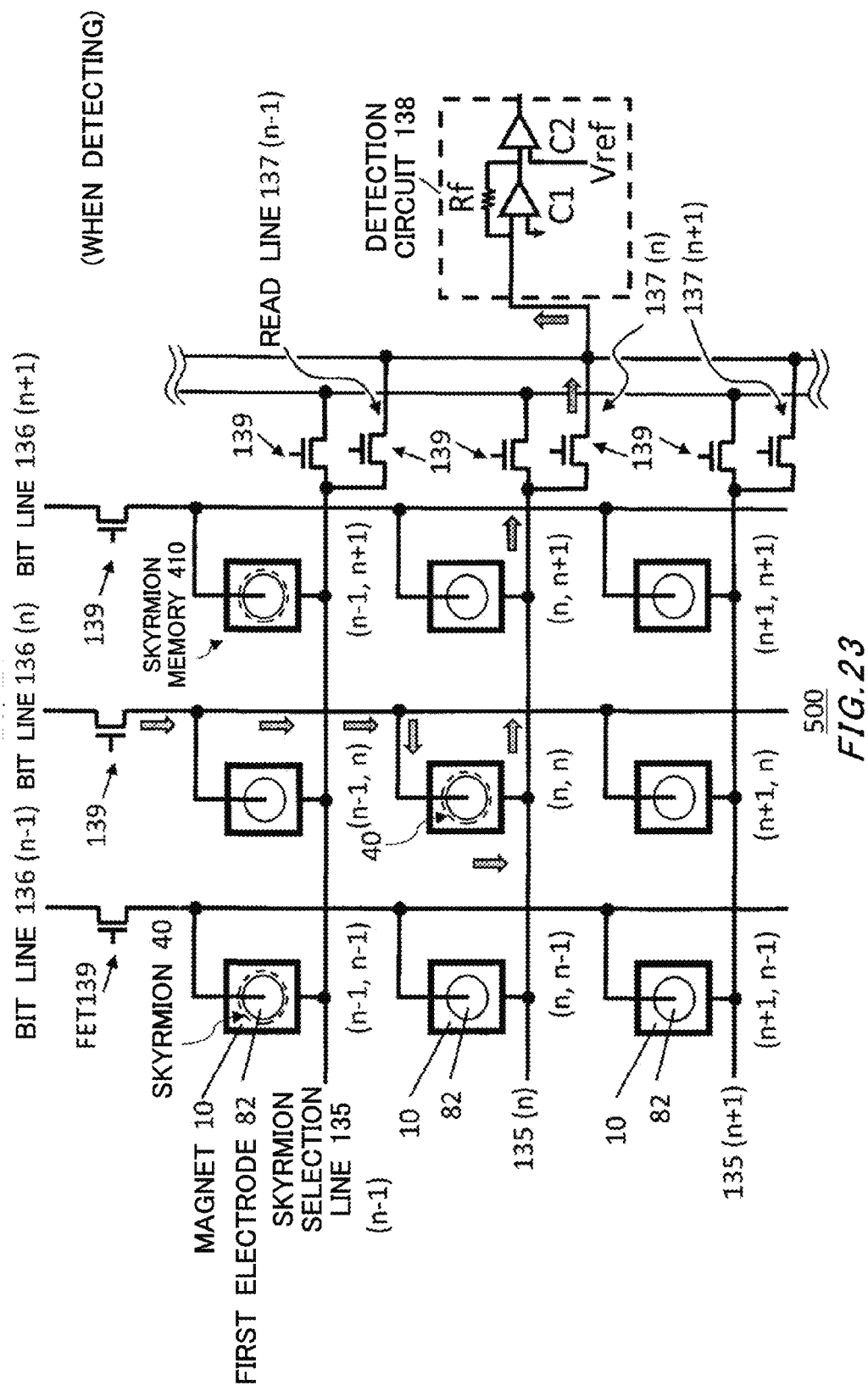

FIG. 23 is a drawing showing one example of a detection circuit 138 of the skyrmion memory device 500.

Figure 24:
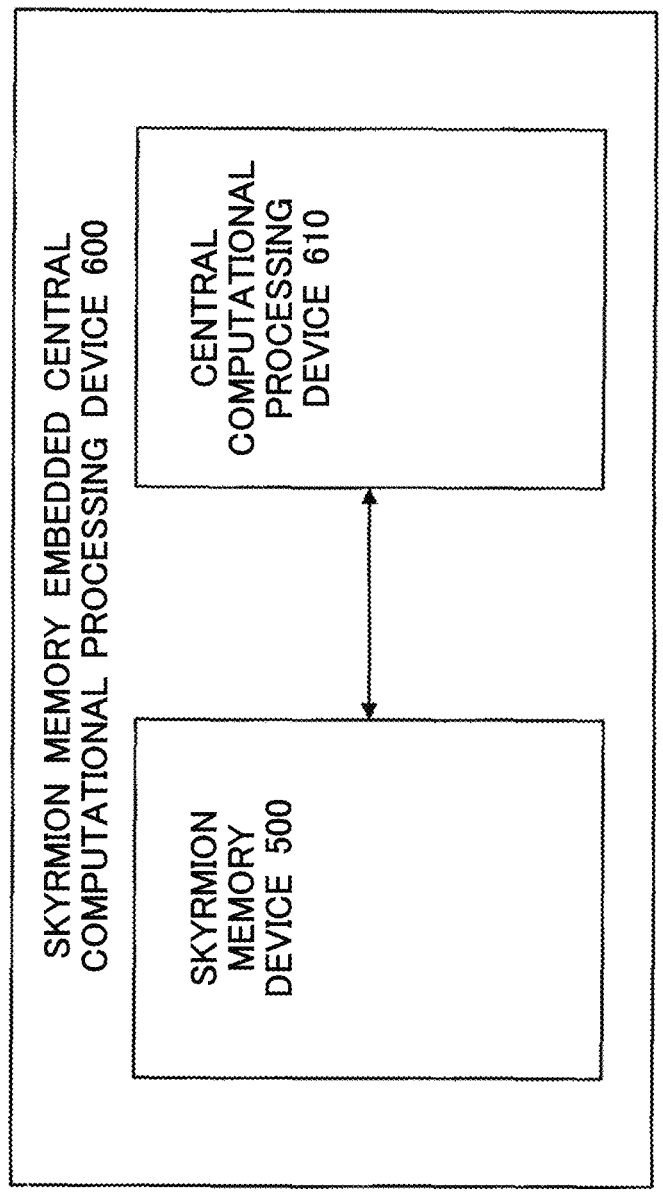

FIG. 24 is a drawing showing a configuration example of a skyrmion memory embedded central computational processing device 600.

Figure 25:
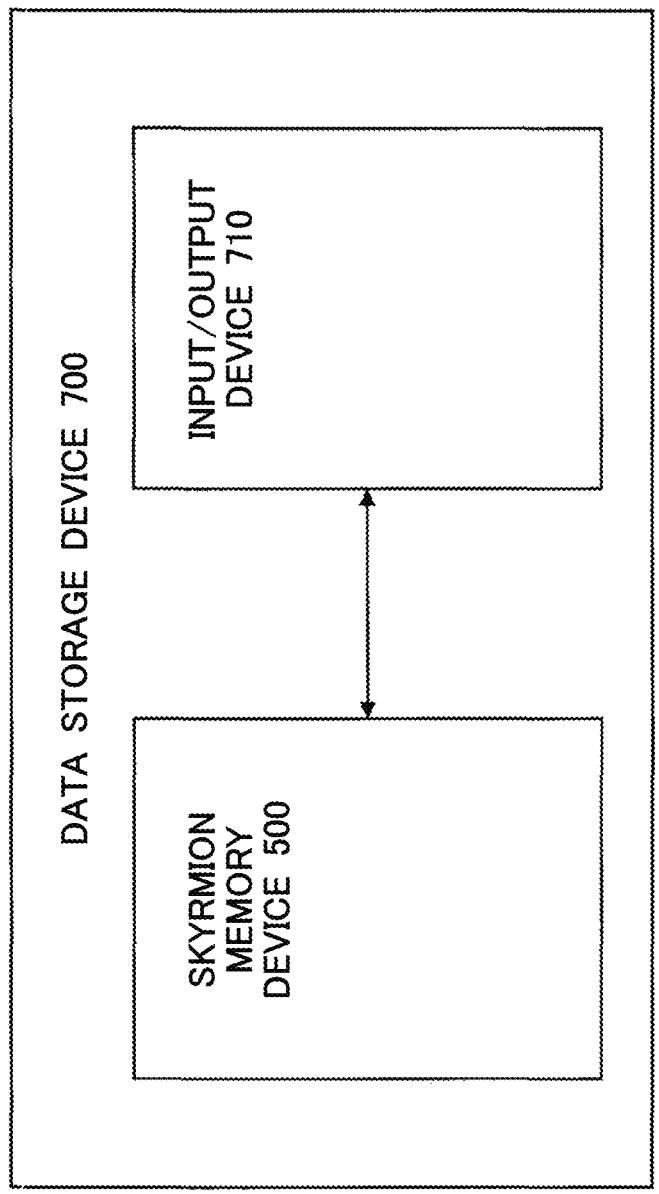

FIG. 25 is a drawing showing a configuration example of a data storage device 700.

Figure 26:
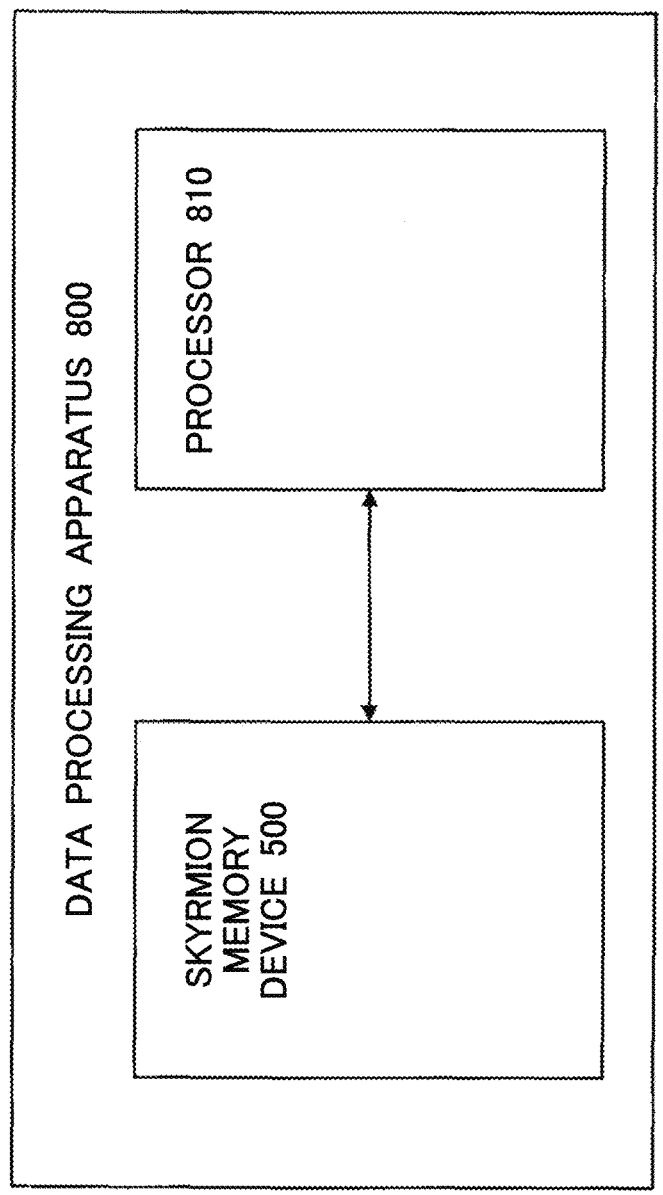

FIG. 26 shows a configuration example of a data processing apparatus 800.

Figure 27:
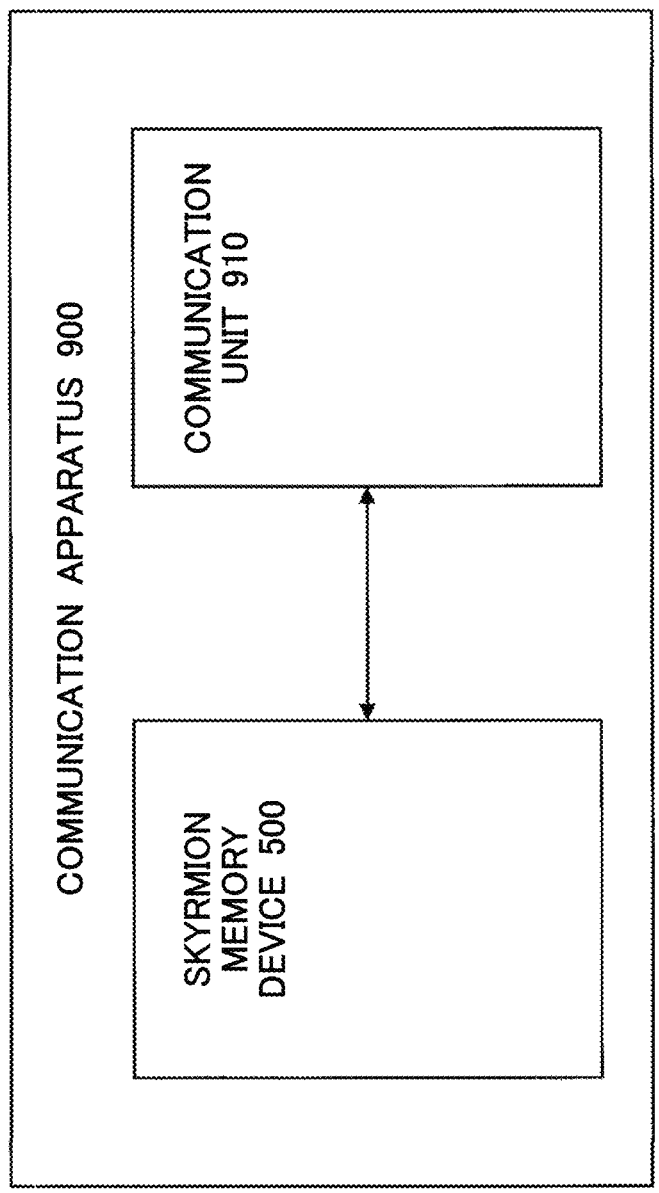

FIG. 27 shows a configuration example of a data communication apparatus 900.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

A chiral magnet is one example of a magnet which is capable of forming a skyrmion. The chiral magnet is a magnet in which a magnetic moment arrangement is a magnetic ordered phase (spiral magnetic phase) to rotate in a spiral pattern in an advancing direction of the magnetic moment when there is no application of an external magnetic field. By applying the external magnetic field, the spiral magnetic phase becomes a ferromagnetic phase from a skyrmion crystal phase in which skyrmions arranged in the close-packed crystal lattice are stabilized.

Figure 1:
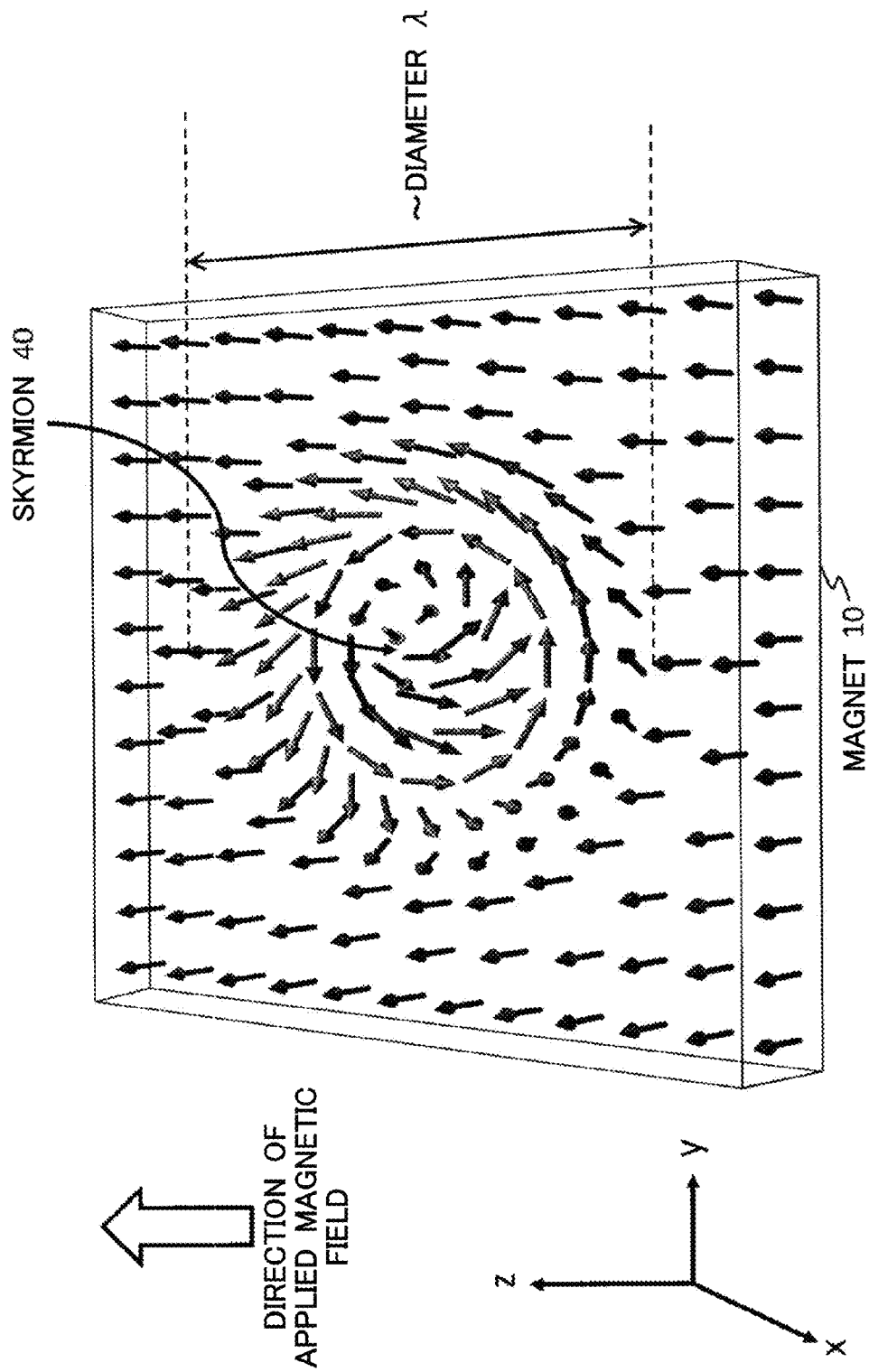
FIG. 1 is a schematic view showing one example of a skyrmion 40 being a nanoscale magnetic texture in a magnet 10.

FIG. 1 is a schematic view showing one example of the skyrmion 40 being a nanoscale magnetic texture in the magnet 10. In FIG. 1, each arrow in the magnet 10 indicates a direction of the magnetic moment in the skyrmion 40. The x axis and the y axis are axes orthogonal to each other, and the z axis is an axis orthogonal to the xy-plane.

The magnet 10 has a plane parallel to the xy-plane. The magnetic moment, which is arranged in the magnet 10 and oriented in any direction, configures the skyrmion 40. The magnetic moment of the outermost circumference of the skyrmion 40 is oriented in the same direction as that of the applied external magnetic field. In the present example, the direction of the magnetic field applied to the magnet 10 is the positive z direction. For this reason, the magnetic moment of the outermost circumference of the skyrmion 40 in the present example is oriented in the positive z direction.

The magnetic moment in the skyrmion 40 swirls in a spiral pattern from the outermost circumference to the inner side. Further, the direction of the magnetic moment gradually changes from the positive z direction to the negative z direction along with the spiral rotation.

The direction of the magnetic moment in the skyrmion 40 continuously twists between the center and the outermost circumference. That is, the skyrmion 40 is a nanoscale magnetic texture having a vortex structure of the magnetic moment. In a case where the magnet 10, in which the skyrmion 40 is present, is a thin plate solid material, the magnetic moment configuring the skyrmion 40 is a magnetic moment oriented in the same direction as a thickness direction of the magnet 10. That is, in a depth direction (z direction) of the plate, there are the magnetic moments oriented in the same direction from the front surface to the back surface. A diameter λ of the skyrmion 40 indicates the diameter of the outermost circumference of the skyrmion 40. The outermost circumference in the present example indicates a circumference of the magnetic moment oriented in the same direction as that of the external magnetic field shown in FIG. 1.

A skyrmion number Nsk characterizes the skyrmion 40 being a nanoscale magnetic texture with a vortex structure. The skyrmion number Nsk can be expressed by the following [Equation 1] and [Equation 2]. In [Equation 2], a polar angle Θ (γ) between the magnetic moment and the z axis is a continuous function of a distance r from the center of the skyrmion 40. The polar angle Θ (γ) changes from π to zero or from zero to π when r is changed from 0 to ∞.

$$Nsk = \frac{1}{4}\pi \int\int d^2 rn(r) \cdot \left[\left(\frac{\partial n(r)}{\partial x}\right) \times \left(\frac{\partial n(r)}{\partial y}\right)\right] \quad \text{[Equation 1]}$$

$$n(r) = (\cos\Phi(\varphi)\sin\Theta(r), \sin\Phi(\varphi)\sin\Theta(r), \cos\Theta(r)) \quad \text{[Equation 2]}$$
$$\Phi(\varphi) = m\varphi + \gamma$$

In [Equation 1], the magnetic moment of the skyrmion 40 in a position r can be expressed as the below-described [Equation 3] which is a vector quantity.

$$n(r) \quad \text{[Equation 3]}$$

In [Equation 2], m indicates vorticity, and γ indicates helicity. According to [Equation 1] and [Equation 2], when Θ(γ) changes from π to zero as r is changed from 0 to ∞, Nsk=−m.

Figure 2:
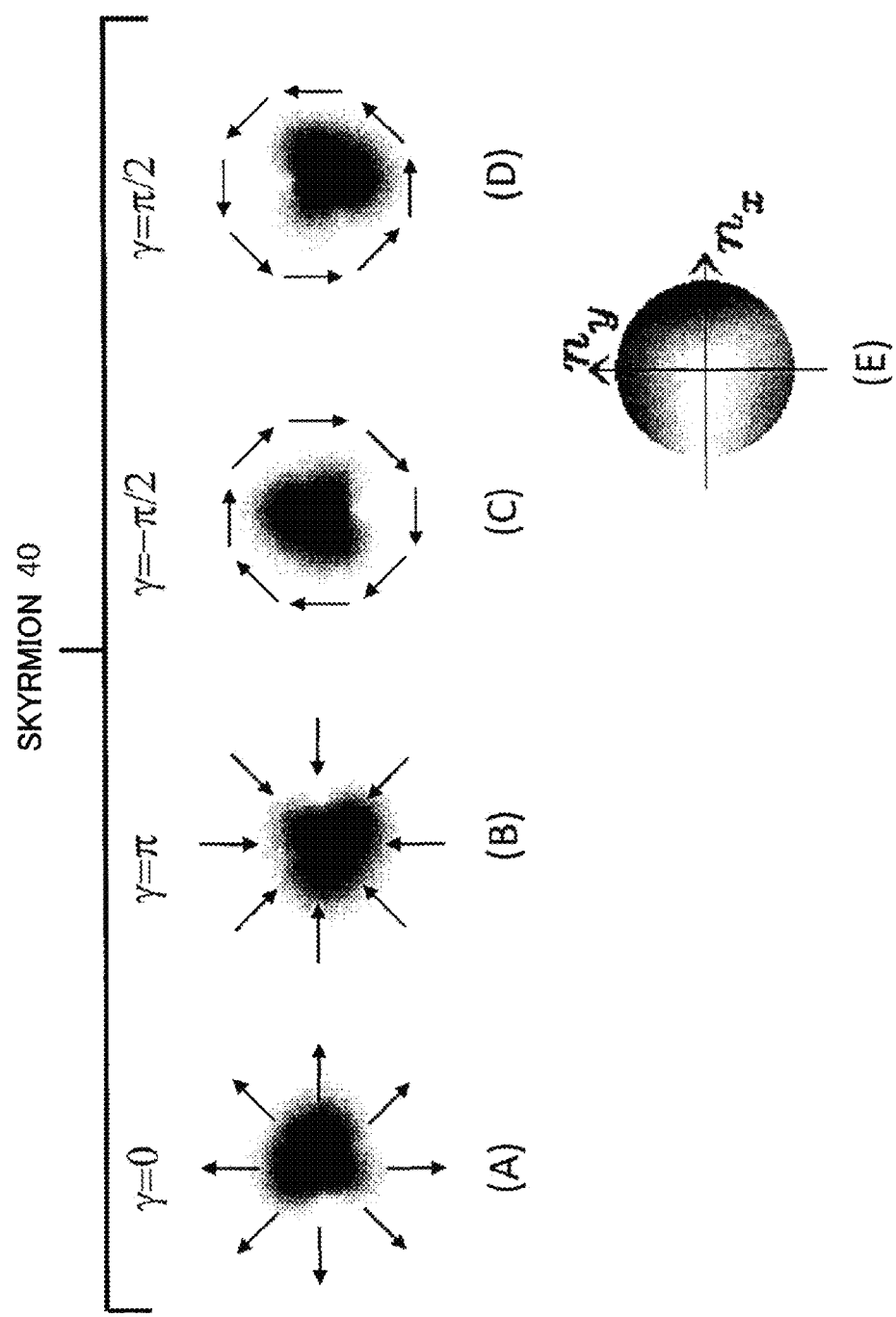
FIG. 2 is a drawing showing the skyrmion 40 with a different helicity γ.

FIG. 2 shows a drawing showing the skyrmion 40 with a different helicity γ. Particularly, FIG. 2 shows one example of a case where the skyrmion number is Nsk=−1.

(E) in FIG. 2 shows a coordinate system (a right-handed system) of coordinates of a magnetic moment n. Since this is a right-handed system, the $n_z$ axis directs in a direction from the rear side toward the front of the paper plane relative to the $n_x$ axis and the $n_y$ axis. Also, (E) of FIG. 2 shows a relationship between gradations and directions of the magnetic moment.

In (A) of FIG. 2 to (D) of FIG. 2, the gradations indicate the directions of the magnetic moment. Each arrow in (A) of FIG. 2 to (D) of FIG. 2 indicates the magnetic moments spaced from the center of the skyrmion 40 by a predetermined distance. The magnetic textures shown in (A) of FIG. 2 to (D) of FIG. 2 are in a state in which the magnetic textures can be defined as the skyrmion 40. As the outermost circumferences in (A) of FIG. 2 to (D) of FIG. 2, areas of the lightest gradation indicate the magnetic moments in a direction from the rear side toward the front of the paper plane. The magnetic moments are shown in white color in the drawings. As the centers of (A) of FIG. 2 to (D) of FIG. 2, areas of the darkest gradation indicate the magnetic moments in a direction from the front toward the rear side of the paper plane. The magnetic moments are shown in black color in the drawings.

Relative to each magnetic moment of (A) of FIG. 2 (γ=0), the direction of each magnetic moment of (B) of FIG. 2 (γ=π) is a direction where each magnetic moment of (A) of FIG. 2 is rotated by 180 degrees. Relative to each magnetic moment of (A) of FIG. 2 (γ=0), the direction of each magnetic moment of (C) of FIG. 2 (γ=−π/2) is a direction where each magnetic moment of (A) of FIG. 2 is rotated by −90 degrees (rotated right by 90 degrees).

Relative to each magnetic moment of (A) of FIG. 2 (γ=0), the direction of each magnetic moment of (D) of FIG. 2 (γ=π/2) is a direction where each magnetic moment of (A) of FIG. 2 is rotated by 90 degrees (rotated left by 90 degrees). The skyrmion 40 with helicity γ=π/2 shown in (D) of FIG. 2 corresponds to the skyrmion 40 in FIG. 1.

Although the magnetic textures of the four examples illustrated in (A) to (D) of FIG. 2 may seem to be different ones, they are topologically the same magnetic textures. The skyrmion 40 having the structures shown in (A) to (D) of FIG. 2 exists stably if it is once created, and functions as a carrier serving for information transmission in the magnet 10 to which the external magnetic field is applied.

Figure 3:
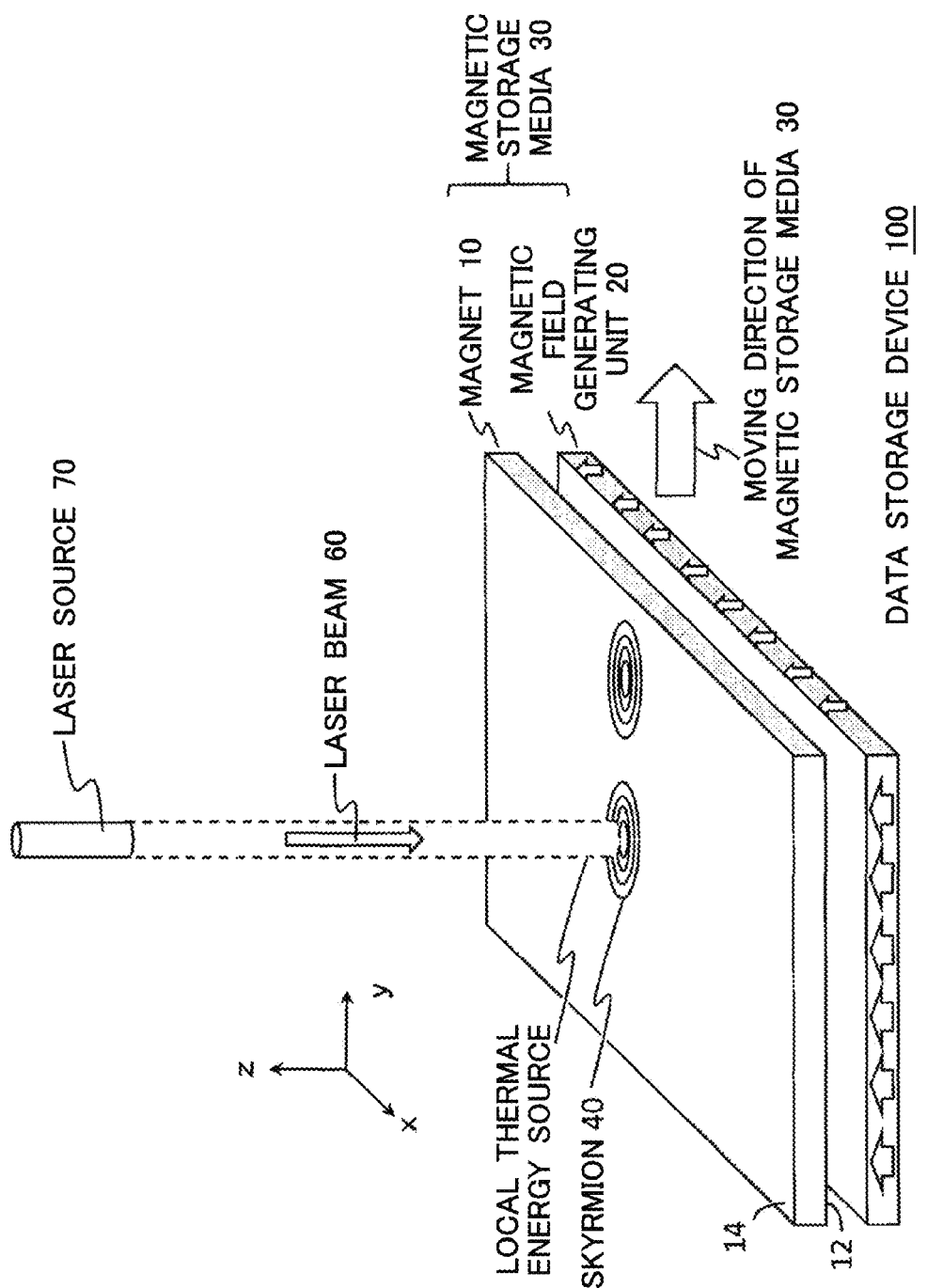
FIG. 3 is a schematic view showing a data storage device 100 for creating or eliminating the skyrmion 40.

FIG. 3 is a schematic view showing a data storage device 100 for creating or eliminating the skyrmion 40. The data storage device 100 has a magnetic storage media 30 and a laser light source 70.

The magnetic storage media 30 has a magnet 10 and a magnetic field generating unit 20. The magnet 10 has a thin-layer shape. The magnet 10 has a thin-film shape. One portion of the magnet 10 with the thin-film shape is shown in FIG. 3. The magnet 10 has two planes parallel to the x-y plane. These two planes indicate a surface 12 with the thin-film shaped magnet 10 and another surface 14 positioned on the opposite side of the surface 12.

The magnet 10 of the present example is a magnet formed in a thin-layer shape with a thickness no more than 500 nm. The magnet 10 is formed by using techniques such as MBE (Molecular Beam Epitaxy) or sputtering method and the like.

In each embodiment, the magnet 10 is a chiral magnet. The chiral magnet includes FeGe or MnSi and the like. The magnet 10 is not limited to a chiral magnet showing the spiral magnetism and may include a dipole magnet, a frustrated magnet, or a lamination structure of a magnetic material and a non-magnetic material.

The dipole magnet is a magnet in which a magnetic dipole-dipole interaction is important for describing the magnetism of the magnet. The frustrated magnet is a magnet including a spatial structure of a magnetic interaction preferring a magnetic mismatching state. The magnet having the lamination structure of the magnetic material and the non-magnetic material is a magnet in which the magnetic moment of the magnetic material in contact with the non-magnetic material is modulated by a spin orbital interaction of the non-magnetic material.

The magnetic field generating unit 20 has a thin-film shape. FIG. 3 shows one portion of the magnetic field generating unit 20 with the thin-film shape. The magnetic storage media 30 has the magnet 10 and the magnetic field generating unit 20 both of which have the thin-film shapes. Therefore, the magnetic storage media 30 also has the thin-film shape.

The magnetic field generating unit 20 is arranged facing the surface 12 of the magnet 10. The magnetic field generating unit 20 is arranged in the negative z direction from the magnet 10. In the present example, the magnetic field generating unit 20 is arranged spaced from a surface 12 of the magnet 10 in the negative z direction and approximately parallel to the surface 12. The magnetic field generating unit 20 is a ferromagnet, for example. In the present example, taking thermal diffusion into account, if the magnetic field generating unit 20 is a metal of the ferromagnet, the magnet 10 is spaced from the magnetic field generating unit 20. It should be noted that, on the other hand, if the magnetic field generating unit 20 is an insulator of the ferromagnet, the magnet 10 may be in contact with the magnetic field generating unit 20.

Arrows in the magnetic field generating unit 20 schematically indicate the magnetic field generated by the magnetic field generating unit 20. The magnetic field as an external magnetic field is applied to the magnet 10.

A laser beam 60 from a laser light source 70 is irradiated on one portion of another surface 14 of the magnet 10. By the irradiation of the laser beam 60, the portion of the other surface 14 of the magnet 10 is heated. In a case of using a blue laser as the laser beam 60, a limitation of the irradiation diameter is from a diffraction limit to approximately several hundreds of nanometers. The irradiation diameter of the laser beam applied to the other surface 14 of the magnet 10 corresponds to the radius of spot size of the local heat energy. In this case, it is sufficient if a magnet to be with a skyrmion diameter of approximately 1 micrometer is adopted. If using a further shorter wavelength laser, it is possible to use a magnet with the skyrmion diameter. It should be noted that as a device for outputting heat energy in order to generate local heat energy, a convergent electron beam generating device for outputting an electron beam converged by a convergence coil may be used.

As the laser beam 60 is applied to the portion of the other surface 14 of the magnet 10 for a predetermined time, the skyrmion 40 being a vortex structure of magnetic moment can be created from the other surface 14 to the surface 12 of the magnet 10. The data storage device 100 synchronizes with bit information to create the skyrmion 40. The data storage device 100 is set "to create" the skyrmion 40 if the bit information indicates "1", and is set "not to create" the skyrmion 40 if the bit information indicates "0". According to the information, the data storage device 100 may store an image. It should be noted that in the present specification, the heat energy refers to heat energy on the other surface 14 of the magnet generated by the laser beam 60, an electromagnetic wave output by the optical antenna 50, a heating needle 55, or the converged electron beam.

In the data storage device 100, the bit information can be converted into the information indicating the presence or absence of the skyrmion 40 at an equal interval in the magnet 10. For example, the magnetic storage media 30 with a disk shape is rotated at a constant speed, to apply on-off of the local heat energy to the other surface 14 of the magnet 10. In this way, the presence or absence of the skyrmion 40 is kept in the magnet 10 which rotates at high speed. The skyrmion 40 can be created as the magnetic moment having the same vortex structure not only on the front surface (the other surface 14) of the magnet 10 but also on the back surface (the surface 12). In this way, the skyrmion 40 can exist stably, as a structure that does not break (not disappear) easily, and statically without moving through positions. Under a weak magnetic field of a human's living environment, the skyrmion 40 does not move or disappear easily.

When reading the presence or absence of the skyrmion 40, it is sufficient if a sensor such as a TMR element is prepared at an upper portion of a desk and the presence or absence of the skyrmion 40 is converted into an electrical signal as the bit information. For elimination of the skyrmion 40, as one example, a greater energy than the energy of the heat energy locally applied to the other surface 14 of the magnet 10 when creating the skyrmion 40 is applied to the other surface 14. In this way, in the magnetic storage media 30, it is possible to create and eliminate the skyrmion 40.

Figure 4:
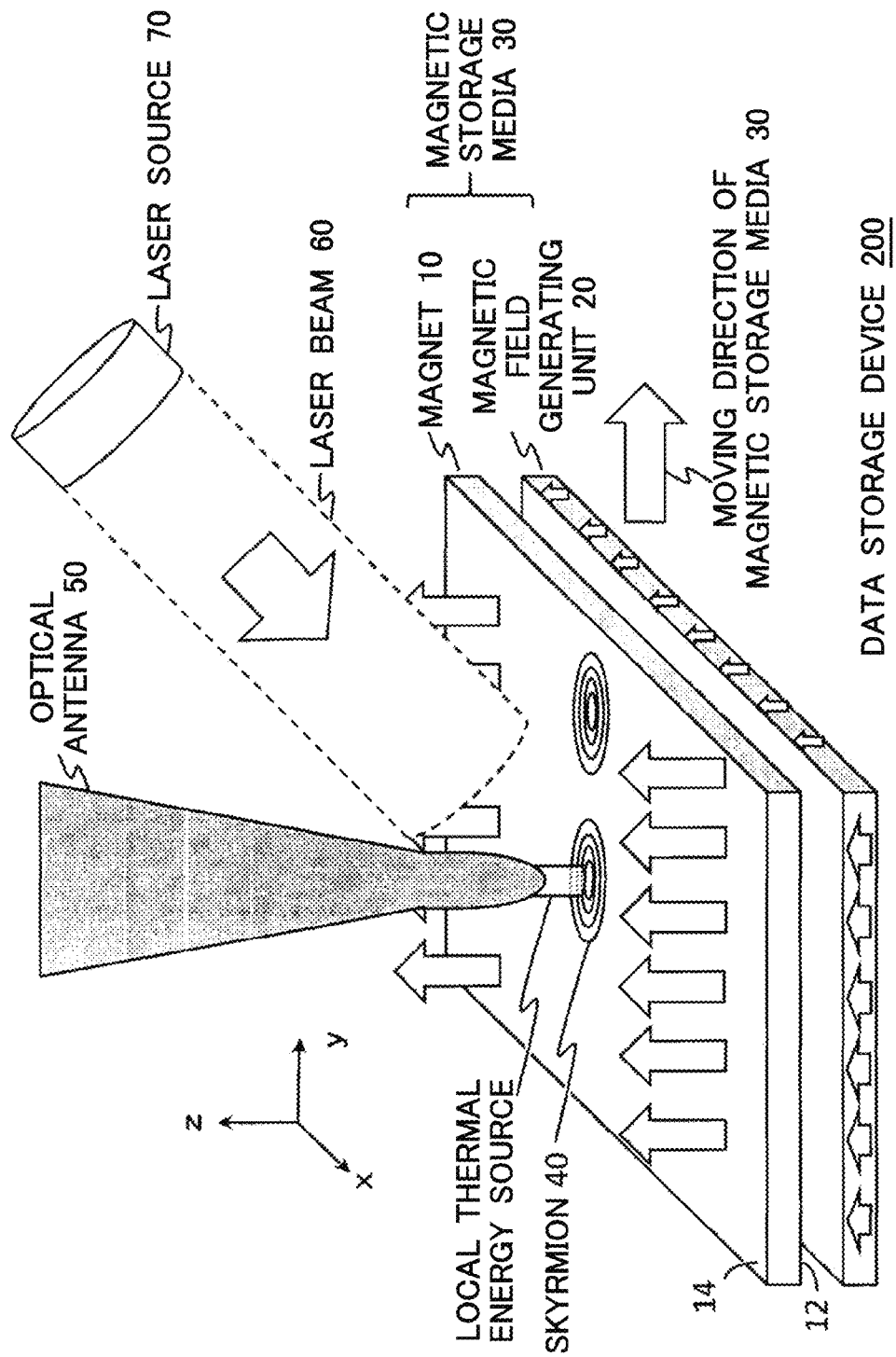
FIG. 4 is a schematic view showing a data storage device 200 for creating or eliminating the skyrmion 40 by using an optical antenna 50.

FIG. 4 is a schematic view showing the data storage device 200 for creating or eliminating the skyrmion 40. The data storage device 200 further includes an optical antenna 50, and applies heat energy to the other surface 14 of the magnet 10 by irradiating the laser beam 60 from laser light source 70 on the optical antenna 50. FIG. 4 is different from the example of FIG. 3 in the above-mentioned matter. The other configurations are the same as the example of FIG. 3.

By irradiating the laser beam 60 to the optical antenna 50 including a metal, it is possible to generate an electromagnetic wave (light) having a minute diameter with a size of several nanometers to several tens of nanometers (nm) from a tip of several nanosizes of the optical antenna 50 (Non-Patent Document 1). The minute diameter of the electromagnetic wave applied to the other surface 14 of the magnet 10 corresponds to the radius of spot size of the local heat energy. As the local heat energy is applied to the other surface 14 of the magnet 10 by irradiating this local electromagnetic wave, the skyrmion 40 can be created in the portion where the electromagnetic wave is irradiated.

Figure 5:
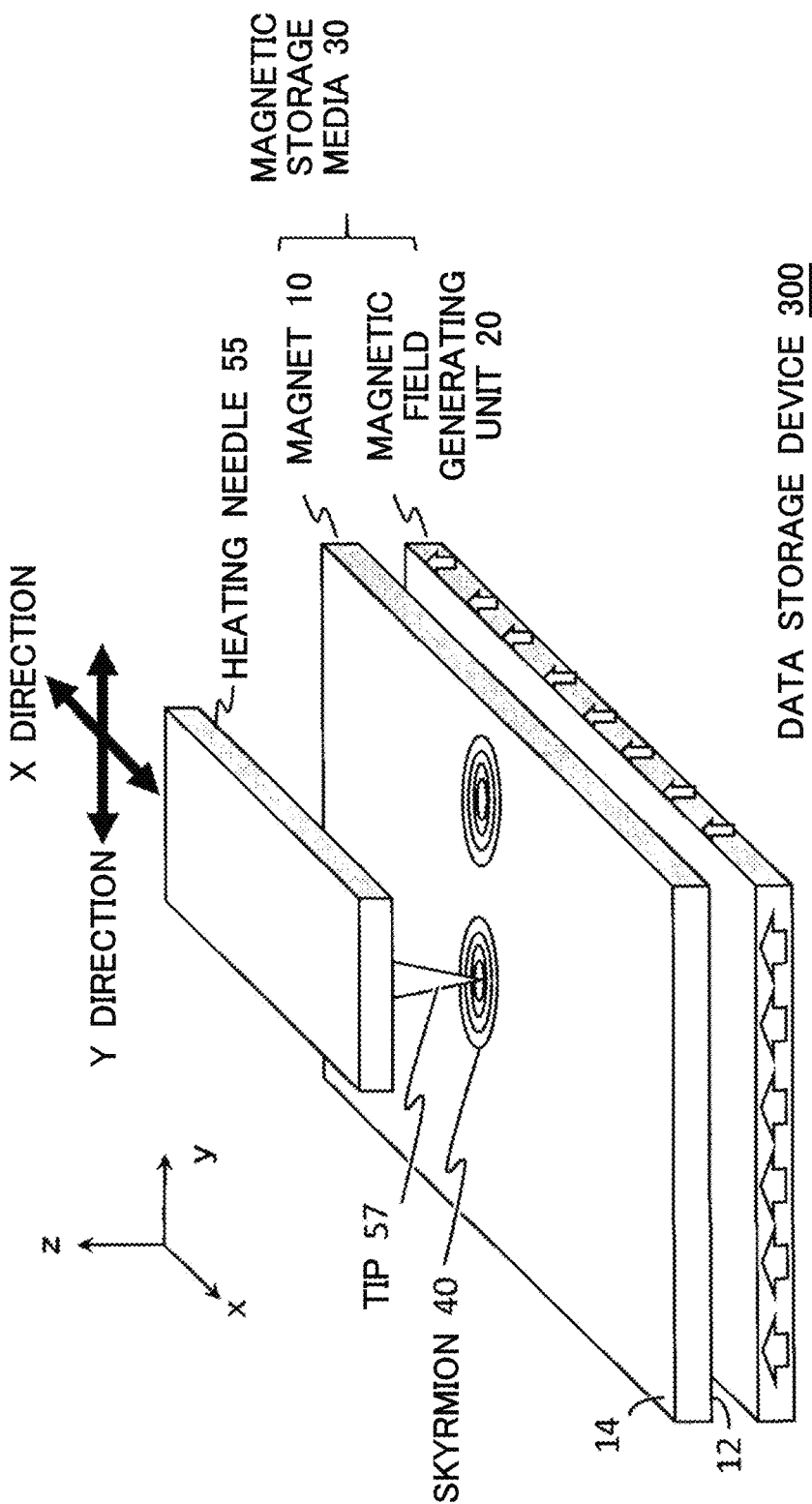
FIG. 5 is a schematic view showing a data storage device 300 for creating or eliminating the skyrmion 40 by using a heating needle 55.

FIG. 5 is a schematic view showing a data storage device 300 for creating or eliminating the skyrmion 40. The data storage device 300 has a heating needle 55 instead of the laser light source 70 of the data storage device 100 to apply the heat energy from a tip 57 of the heating needle 55 to the other surface 14 of the magnet 10. FIG. 5 is different from the example of FIG. 3 in the above-mentioned matter. The other configurations are the same as the example of FIG. 3.

Heating method using a heating needle is a known technique (Non-Patent Document 2). The heating needle having a heater can be formed by a fine fabrication. By causing the heating needle 55 having a heater to be in contact with a portion of the other surface 14 of the magnet 10, the magnet 10 can be locally heated. At the tip 57 of the heating needle 55, the radius in the x-y plane of the portion in contact with the other surface 14 of the magnet 10 corresponds to the radius of spot size of the local heat energy.

A plurality of heating needles 55 are arranged in a two-dimensional surface and in a matrix array. This is because that a movable range of one heating needle 55 is limited. In FIG. 5, only one of the heating needles 55 arranged in the matrix array is shown. An actuator for moving the heating needle 55 in the x direction and the y direction is connected to the heating needle 55. An actuator for moving the heating needle 55 in the z direction is also connected to the heating needle 55. By the actuator for moving the heating needle 55 in the z direction, a needle pressure of the tip 57 of the heating needle 55 can be adjusted. In a case of using the heating needle 55, the skyrmion 40 is formed in the magnet 10 by locally heating the magnet 10 while sweeping the heating needle 55 in the x direction and the y direction by the actuator. For this reason, in a case of using the heating needle 55, it is not necessary to rotate the magnet 10.

Figure 6:
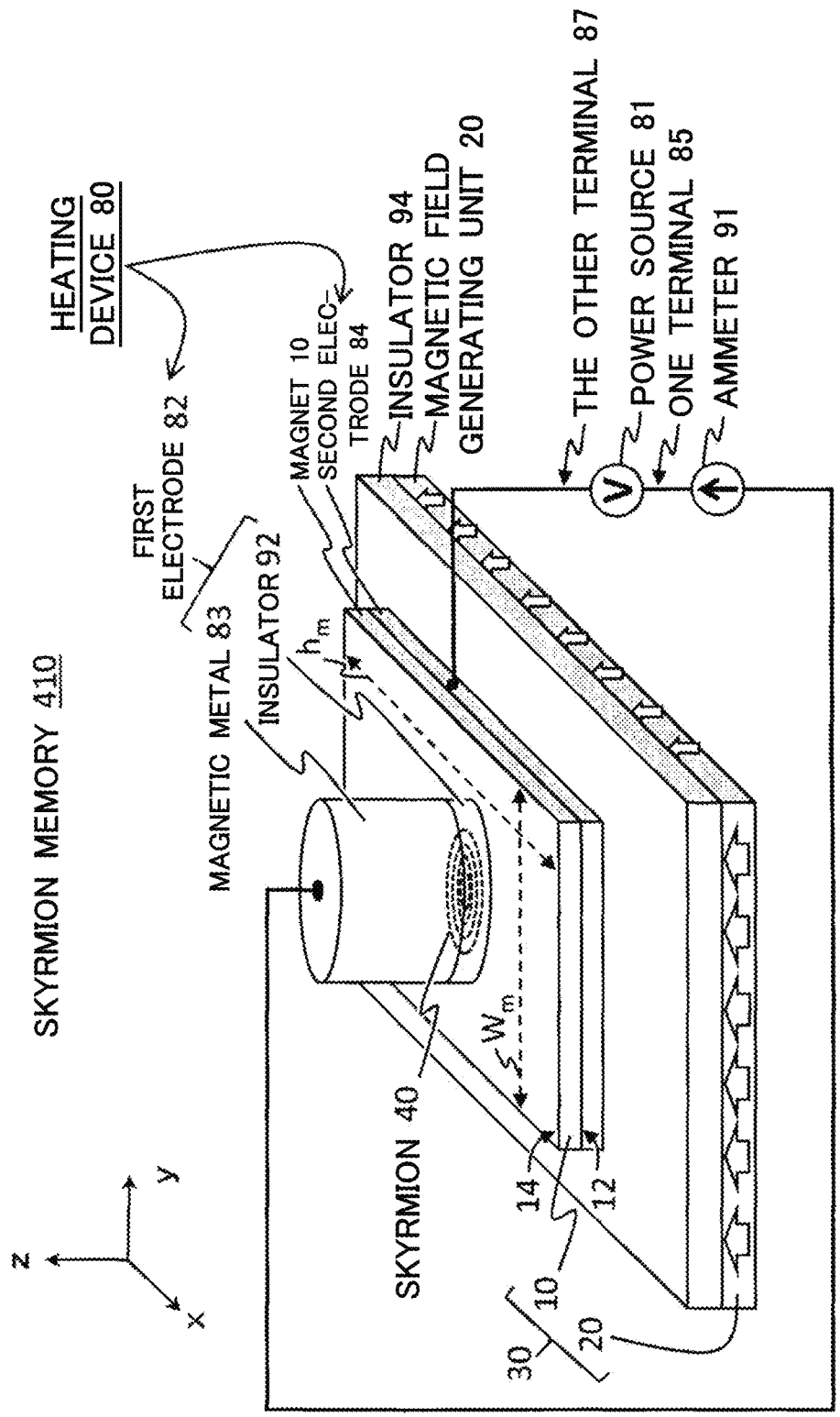
FIG. 6 is a schematic view showing a skyrmion memory 410 for creating or eliminating the skyrmion 40 by using a heating device 80 with an electrode configuration.

FIG. 6 is a schematic view showing the skyrmion memory 410 for creating or eliminating the skyrmion 40, which uses the heating device 80 using an electrode. This is a skyrmion memory for creating and eliminating the skyrmion by heating the magnet 10 using the electrode on the magnet 10, which is different from the heating mechanism such as a laser beam from the outside of the magnet 10 having been described above. A heating device 80 is manufactured by a fine fabrication technique. In this case, the heating device from the outside is not necessary. The skyrmion memory 410 can be utilized as a memory device. The case of heating by the electrode can be handled similar to the example of heating from the outside, since the creation and the elimination of the skyrmion by the heating energy are possible. The skyrmion memory 410 has the magnet 10, the magnetic field generating unit 20, a first electrode 82, a second electrode 84, and an ammeter 91. The heating device 80 has the first electrode 82 and the second electrode 84. The first electrode 82 has an insulator 92 arranged in contact with the upper portion of the other surface 14 of the magnet 10, and a magnetic metal 83 arranged in contact with the upper portion of the insulator 92. The second electrode 84 includes a metal arranged in contact with a lower portion of the surface 12 of the magnet 10. A power source 81 is not a component of the skyrmion memory 410. In the present specification, the terms "on" and "over" refer to the +z direction from a surface 12 toward another surface 14 of the magnet 10. Also, the terms "below" and "under" refer to the −z direction from the other surface 14 toward the surface 12 of the magnet 10.

In the present example, the magnetic metal 83 of the first electrode 82 is a cylindrical magnetic metal. The magnetic metal 83 may have a fine shape approximately the same as the heating needle 55. A circular cross-sectional area of the magnetic metal 83 is an area in contact with the other surface 14 of the magnet 10, and a radius of the circular cross section of the magnetic metal 83 corresponds to the radius of spot size of the local heat energy. The insulator 92 is formed between the magnetic metal 83 and the magnet 10. The magnet 10 and the second electrode 84 are plates parallel to the x-y plane. A width is set as $W_m$ and a height is set as $h_m$, of the size of the magnet 10. In the present example, with respect to a diameter $\lambda$ of the skyrmion 40 to be created, the magnet 10 has a size where $W_m > \lambda/2$ and $h_m > \lambda/2$. Lower limit values of the above-described width and height are in a range of lower limit values by which a single skyrmion 40 exists stably in the magnet 10. The size of the second electrode 84 may be the same size as the first electrode 82. Also, the size of the second electrode 84 may be a larger size than the magnetic metal 83.

The first electrode 82 in the present example has a magnetic metal 83 which is capable of applying currents. The magnetic metal 83 is Co, Ni and Fe being ferromagnetic metals, or a laminated ferromagnetic metal thin film including these ferromagnetic metals. The second electrode 84 in the present example may be the ferromagnetic metal, or may be Cu, W, Ti, Al, Pt, Au, TiN, and AlSi which are non-magnetic metals, and the like. The second electrode 84 may be a magnetic metal for creating the skyrmion. In this case, it is no longer necessary to form the second electrode 84. In a case where a resistance value of the magnetic metal for creating the skyrmion 40 is high, it is necessary to set the second electrode 84 by further arranging another metal material. This is because that it is necessary to locally heat the area of the heating position.

A terminal 85 of the power source 81 on one end is electrically connected to the magnetic metal 83 of the first electrode 82. A terminal 87 of the power source 81 on the other end is electrically connected to the second electrode 84. The power source 81 can cause currents to flow in a pulse pattern between the magnetic metal 83 and the second electrode 84 by a switch connected to the power source 81. The switch is a FET transistor. The magnet 10 can be heated by a pulsed Joule heat generated when the pulse current flows through the insulator 92 in the first electrode 82. Since the currents flow through a contact cross section between the insulator 92 and the magnetic metal 83 in the insulator 92, a local heat can be generated in a circular cross-section size of the magnetic metal 83.

An electrode configuration shown in FIG. 6 also functions as a skyrmion sensor. The magnetic metal 83 of the first electrode 82 includes a ferromagnetic metal. The magnetic moment of the magnetic metal 83 in response to a perpendicular magnetization (z direction) from the magnetic field generating unit 20 becomes to be in the z direction. For example, in a case where the skyrmion 40 is not present, the magnetic moment of the magnet 10 is oriented in the z direction. In this case, the magnetic moment of the magnetic metal 83 and the magnetic moment of the magnet 10 are oriented in an upward direction together. For this reason, a tunnel current flowing through the insulator 92 indicates a large current value compared to a case where the skyrmion 40 is present. On the other hand, in a case where the skyrmion 40 is present, since a spiral magnetic moment of the skyrmion 40 exists in the magnet 10, the magnetic moments in many directions other than the +z direction are present. For this reason, the tunnel current flowing through the insulator 92 becomes smaller compared to a case where the skyrmion 40 is not present. The presence or absence of the skyrmion 40 of the magnet 10 is detected by the size of this tunnel current. The magnetic moment with the vortex structure of the skyrmion is a structure penetrating from the back surface (the surface 12) to the front surface (the other surface 14) of the magnet 10. For that reason, a large scattering effect is given to the tunnel current. Therefore, the detection sensitivity is high.

Hereinafter, the first to the fifth embodiments for creating the skyrmion 40 are shown.

[First Embodiment]

In the first embodiment, a simulation experiment result of creating the skyrmion 40 by applying local heat energy to the other surface 14 of the magnet 10 is shown. The creation or elimination of the skyrmion 40 by the local heat energy can be expressed by the below-described [Equation 4].

$$\frac{dn(r)}{t} = \left\{ -\frac{\partial H}{\partial n(r)} + h_{T(r)}(t) \right\} \times n(r) + \alpha n(r) \times \frac{dn(r)}{t} \quad \text{[Equation 4]}$$

In [Equation 4], H indicates Hamiltonian for expressing the magnet 10. The external magnetic field can be expressed by [Equation 5] being a vector quantity. α indicates a Gilbert damping constant.

$$h_{T(r)}(t) = (h_{T(r),x}(t), h_{T(r),y}(t), h_{T(r),z}(t(t))) \quad \text{[Equation 5]}$$

A local distribution of the temperatures is set as the below-described [Equation 6], and if the coordinates μ, ν=x,y, z, a fluctuation of the local magnetic field by the local distribution of the temperatures follows a statistical Gaussian distribution. The fluctuation of the local magnetic field can be expressed by the below-described [Equation 7]. $k_B$ indicates a Boltzmann constant.

$$T(r) \quad \text{[Equation 6]}$$

$$\langle h_{T(r),\nu}(t)\rangle = 0$$

$$\langle h_{T(r),\mu}(t) \cdot h_{T(r'),\nu}(t')\rangle = 2k_B T(r)\alpha \delta_\mu \delta_\nu \delta(r-r')\delta(t-t') \quad \text{[Equation 7]}$$

Also, the Hamiltonian H in the chiral magnet can be expressed by [Equation 8].

$$H = -J\Sigma n(r) \cdot \{n(r+ae_x) + n(r+ae_y)\} + D\Sigma\{n(r) \times n(r+ae_x) \cdot e_x + n(r) \times n(r+ae_y) \cdot e_y\} - h\Sigma n_z(r) \quad \text{[Equation 8]}$$

In [Equation 8], J indicates a dimension of the magnetic exchange interaction of the magnet. D indicates a constant showing the Dzyaloshinskii-Moriya interaction. a indicates a lattice constant of the magnet 10. Also, $e_x$ and $e_y$ respectively indicate unit vectors in the x-axis direction and the y-axis direction. For the dipole magnet, the frustrated magnet, or the laminated magnet, it is sufficient if this expression of the Hamiltonian H is replaced with those describing the respective magnetic bodies.

In a simulation, each type of physical quantities is described by standard values according to a dimension J of the magnetic exchange interaction, which are values specific to the magnet materials. In the present example, D=0.15 J, and α=0.01.

Figure 7:
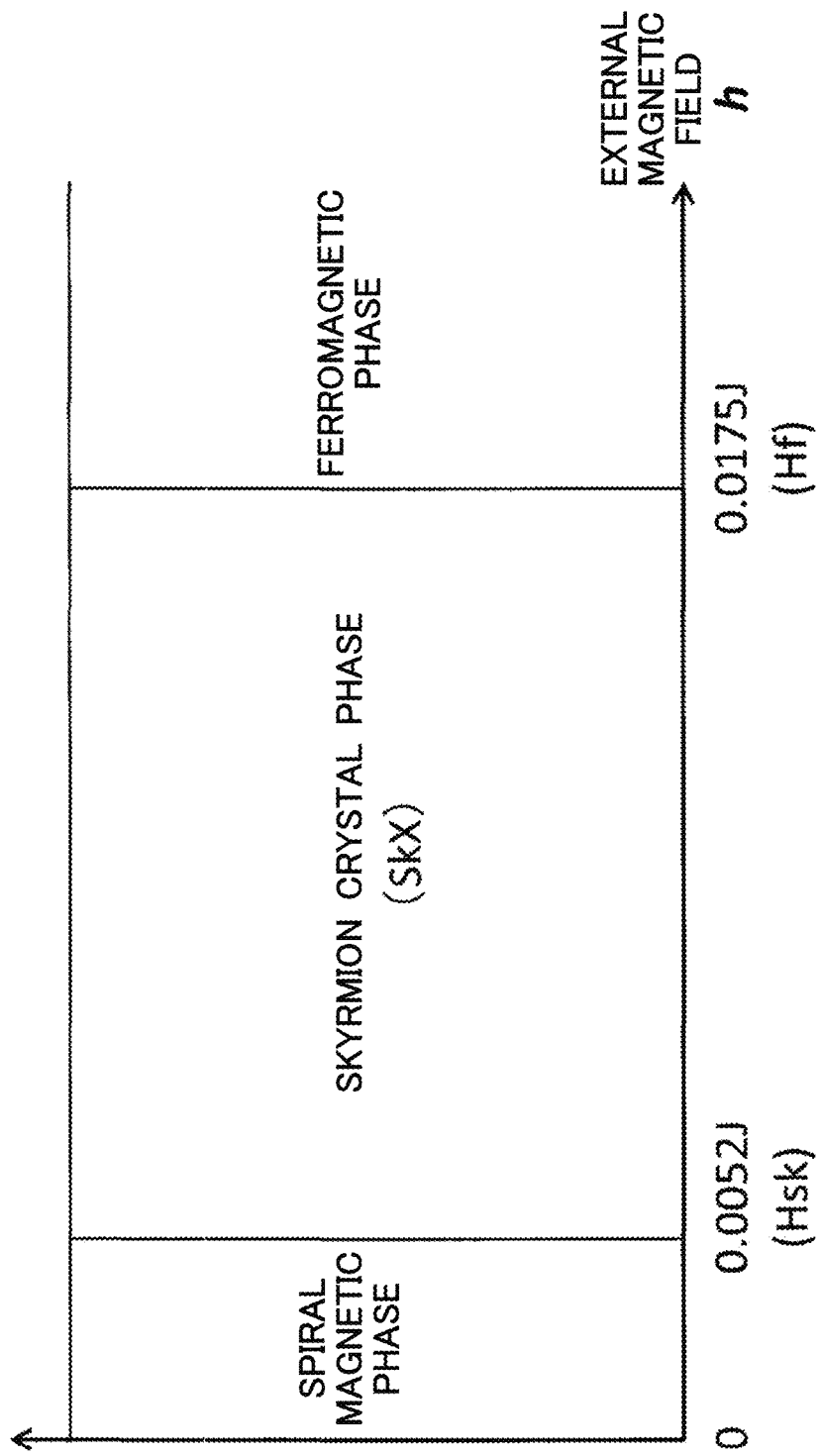
FIG. 7 shows a magnetic phase diagram of the magnet 10 used for simulation.

FIG. 7 shows a magnetic phase diagram of the magnet 10 used in the simulation. The horizontal axis indicates the external magnetic field [Equation 5] acting in the magnet 10 by the dimension J of the magnetic exchange interaction and the values. The magnet 10 of the present example is the chiral magnet.

The external magnetic field [Equation 5] is applied to the magnet 10 in the positive z direction. In the chiral magnet, a plurality of phases are exhibited in response to the external magnetic field [Equation 5] applied from the magnetic field generating unit 20.

In a case where the external magnetic field [Equation 5] is zero, the chiral magnet has a spiral magnetic phase with the magnetic texture of the spiral magnetic moment. In a case where the external magnetic field [Equation 5] is in a range equal to or more than zero and less than 0.0052 J, the chiral magnet being the magnetic texture of the spiral magnetic moment exhibits the spiral magnetic phase. The external magnetic field [Equation 5]=0.0052J is expressed by Hsk as the magnetic field where the skyrmion crystal phase is generated.

If the external magnetic field [Equation 5]=0.0052J (Hsk), the chiral magnet becomes a skyrmion crystal phase (SkX). In the skyrmion crystal phase (SkX), a plurality of skyrmions 40 become two-dimensional close-packed crystal lattice structures and are generated in the xy-plane. In a case where the external magnetic field [Equation 5] is in a range equal to or more than 0.0052 J (Hsk) and less than 0.0175 J, the chiral magnet exhibits the skyrmion crystal phase (SkX).

If the chiral magnet is the skyrmion crystal phase (SkX), the diameter λ of the skyrmion 40 can be expressed as the following [Equation 9] by using the dimension J of the magnetic exchange interaction and D.

$$\lambda = 2\sqrt{2} \cdot \pi J \cdot a / D \qquad \text{[Equation 9]}$$

Here, a indicates a lattice constant of the chiral magnet used in the simulation. In the chiral magnet, the diameter λ of the skyrmion 40 is a nanometer size from several nanometers to several hundreds of nanometers. In the present example, since D=0.15 J, λ=60a. In a case of a magnet with a lattice constant a being 5 angstrom, λ=300 angstrom=30 nm. Since D being a physical constant indicating the dimension of the Dzyaloshinskii-Moriya interaction is a physical constant specific to the substance, according to [Equation 9], the diameter λ of the skyrmion 40 becomes a constant specific to the substance. As described in Non-Patent Document 3, for example, the diameter λ of the skyrmion 40 is 70 nm for FeGe, and is 18 nm for MnSi.

In the chiral magnet used in the present example, a ferromagnetic phase is exhibited if the external magnetic field [Equation 5]=0.0175J. In the ferromagnetic phase, all magnetic moments of the chiral magnet are oriented in the positive z direction, which is the same direction as the application direction of the external magnetic field [Equation 5]. The external magnetic field [Equation 5]=0.0175J is expressed by Hf as a magnitude of the magnetic field where the ferromagnetic phase is exhibited.

A procedure for creating the skyrmion 40 in the chiral magnet will be described. First, another magnetic field generating unit different from the magnetic field generating unit 20 is close to the magnetic storage media 30. The other magnetic field generating unit applies a magnetic field, which causes the chiral magnet to be in a ferromagnetic state, to the chiral magnet as the magnet 10 and to the magnetic field generating unit 20. The other magnetic field generating unit is, for example, a magnet of the ferromagnet which causes the chiral magnet of the magnetic storage media 30 at the time of factory shipment to be in the ferromagnetic state. In the present example, the other magnetic field generating unit applies an external magnetic field [Equation 5] larger than 0.0175 J (Hf) to the chiral magnet. In this case, all magnetic moments of the chiral magnet are oriented in the positive z direction which is the same direction as the application direction of the external magnetic field [Equation 5]. Also, according to the magnetic field applied by the other magnetic field generating unit, the magnetic field generating unit 20 becomes to be capable of generating a predetermined magnetic field aligned in the z direction. If this process is not performed, a magnetic texture with different directions will remain in the magnetic field generating unit 20.

After that, the other magnetic field generating unit is separated from the magnetic storage media 30 and the magnetic field generating unit 20. The magnetic field generating unit 20 is a magnetic field to cause the chiral magnet to be in a metastable ferromagnetic state, and generates a magnetic field corresponding to the skyrmion crystal phase (SkX) of the chiral magnet. Therefore, after the chiral magnet becomes to be in the ferromagnetic state by the other magnetic field generating unit, the magnetic field generating unit 20 causes the chiral magnet to be in the metastable ferromagnetic state.

In the present example, the magnetic field generating unit 20 applies an external magnetic field of 0.015 J smaller than 0.0175 J (Hf) to the chiral magnet. Even if in this case, the chiral magnet is in the ferromagnetic state and is metastable, and the skyrmion 40 cannot be created in the chiral magnet. That is, the chiral magnet is in the ferromagnetic state and is metastable even if h of the external magnetic field [Equation 8] smaller than 0.0175 J (Hf) is applied. It should be noted that in the present specification, the ferromagnetic state means a state where each magnetic moment in the magnet 10 is oriented in the same direction as the direction of h of the external magnetic field [Equation 8]. Also, the metastable ferromagnetic state means a state where the ferromagnetic state is maintained by a hysteresis effect since a magnetic field corresponding to the ferromagnetic phase has been previously applied to the magnet 10, although a magnetic field corresponding to the skyrmion crystal phase (SkX) of the magnet 10 is currently applied to the magnet 10.

Figure 8:
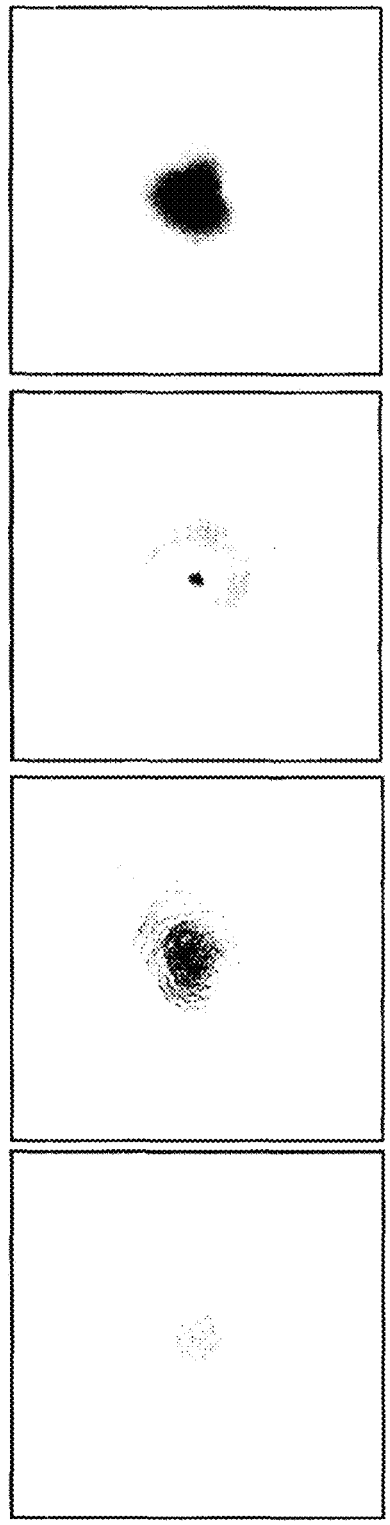
FIG. 8 is a drawing showing a result of a simulation experiment indicating a creation of the skyrmion 40 according to a first embodiment.
Figure 8:
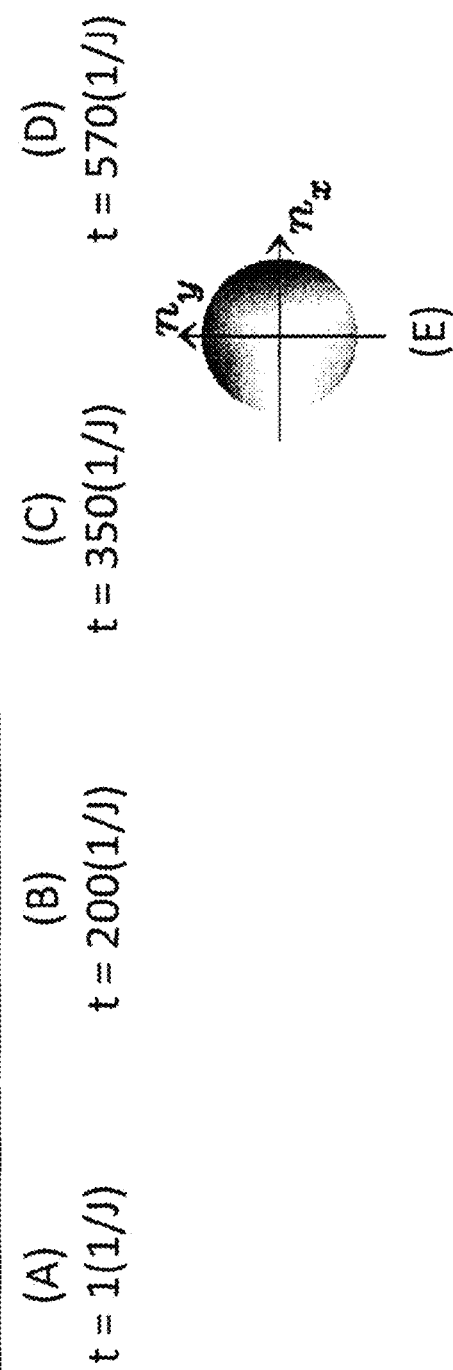

FIG. 8 is a drawing showing a result of a simulation experiment indicating a creation of the skyrmion 40 according to the first embodiment. As mentioned above, this is a simulation result in a case where the local heat energy is applied to the other surface 14 of the magnet 10 when D=0.15 J and α=0.01, and the external magnetic field [Equation 5] applied to the chiral magnet is set as 0.015 J from a magnetic field stronger than 0.0175 J (Hf) to be in the metastable ferromagnetic state.

The size of the magnet 10 has a size of 300×300 in units of the lattice constant a. As a boundary condition, a periodic boundary condition is used for the x and y directions. According to this condition, a simulation condition in an infinite state on two-dimensional plane is set. The spot size of the local heat energy applied to the other surface 14 of the magnet 10 is set as a radius of 20a. In a central portion of the other surface 14 of the magnet 10, the local heat energy is applied for a time where 0≤t≤200 (1/J). A temperature of a position of the magnet 10 to which the local heat energy is applied in the specific spot size is expressed by a temperature T. The local heat energy corresponds to $k_B T$=1.0 J. Also, the time is expressed by 1/J using J. Similar to (E) of FIG. 2, (E) of FIG. 8 shows a coordinate system (a right-handed system) of the coordinates of the magnetic moment n.

(A) to (D) of FIG. 8 respectively show time changes of the magnetic moment when the local heat energy is applied to the central portion of the other surface 14 of the magnet 10. (A) of FIG. 8 shows the magnetic moment at the time t=1 (1/J). At the time t=1 (1/J), an disorder of the magnetic moment with a size of 20a occurs in the central portion of the other surface 14 of the magnet 10 to which the local heat energy is applied.

(B) of FIG. 8 shows the magnetic moment at the time t=200 (1/J). At t=200 (1/J), the application of the local heat energy having been continued from t=0 (1/J) is stopped. At t=200 (1/J), a clearly single skyrmion 40 is clearly being created. By a diffusion of the local heat energy from the central portion to the periphery of the other surface 14 of the magnet 10, a situation where the disorder of the magnetic moment diffuses from the central portion to the periphery can be recognized.

(C) of FIG. 8 shows the magnetic moment at the time t=350 (1/J). The black spot of the central portion of the other surface 14 of the magnet 10 indicates the magnetic moment in the negative z direction. (D) of FIG. 8 shows the magnetic moment at the time t=570 (1/J). At the time t=570 (1/J), the creation of the stable skyrmion 40 is completed. The size of the magnet 10 in the simulation shown in FIG. 8 is in an infinite state on two-dimensional plane. On the other hand, in a case where the size of the magnet 10 has limits in the width $W_m$ and the height $h_m$, the magnet 10 has to have a size of $W_m > \lambda/2$ and $h_m > \lambda/2$, with respect to the diameter $\lambda$ of the skyrmion 40. If the size is smaller than the above, the skyrmion 40 created by the local heat energy disappears.

[Second Embodiment]

Figure 9:
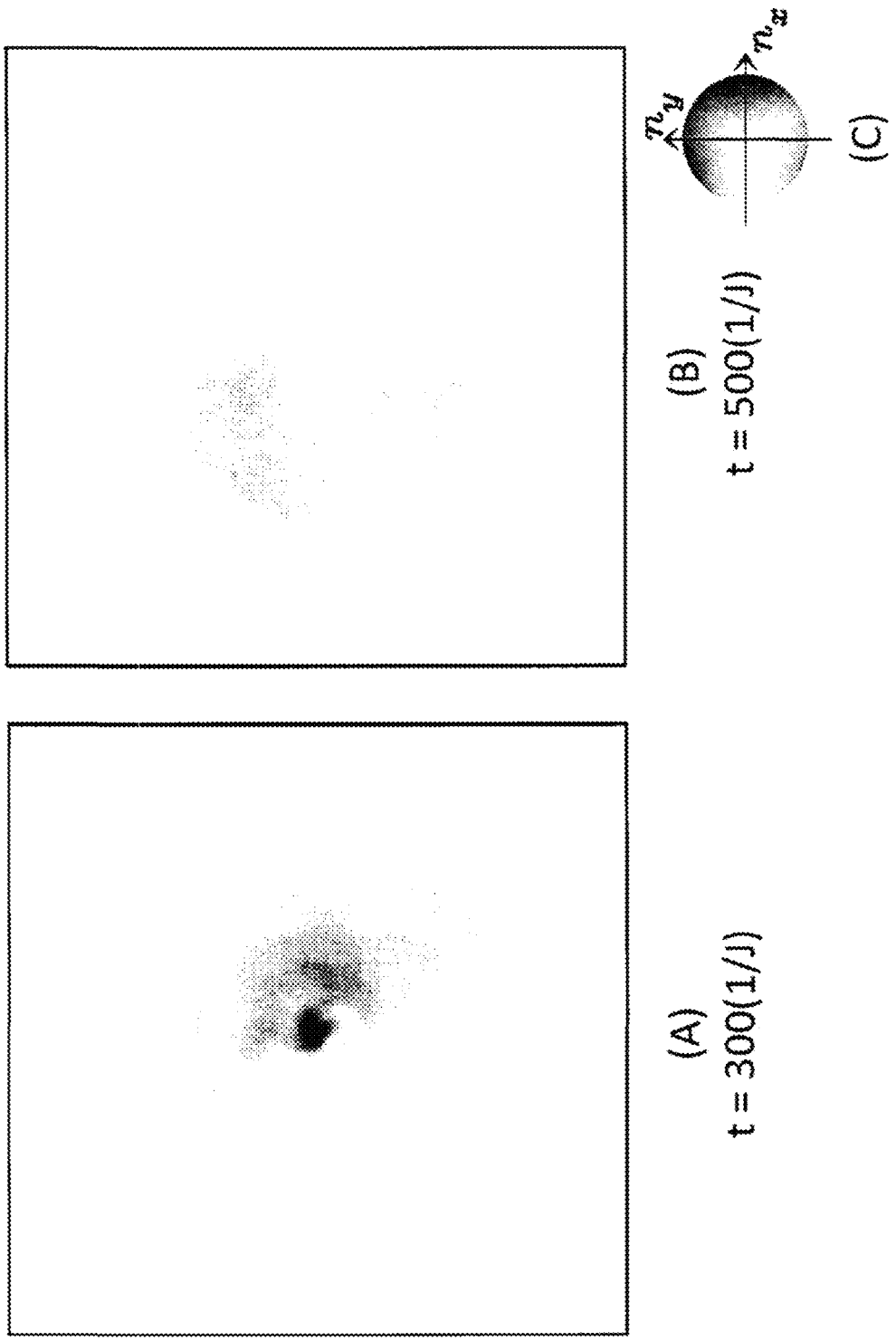
FIG. 9 is a drawing showing a result of a simulation experiment indicating an elimination of the skyrmion 40 according to a second embodiment.

FIG. 9 is a drawing showing a result of a simulation experiment indicating the elimination of the skyrmion 40 according to the second embodiment. As mentioned above, this is a simulation result in a case where the local heat energy is applied to the other surface 14 of the magnet 10 when D=0.15 J and $\alpha$=0.01, and the external magnetic field [Equation 5] applied to the chiral magnet is set as 0.015 J from a magnetic field stronger than 0.0175 J (Hf) to be in a metastable ferromagnetic state. The spot size of the local heat energy applied to the other surface 14 of the magnet 10 is set as the radius of 20a. The local heat energy is applied to the central portion of the other surface 14 of the magnet 10 for a time of 0≤t≤200 (1/J). As mentioned above, the temperature of the position of the magnet 10 to which the local heat energy is applied in the specific spot size is expressed by a temperature T. In the present example, the local heat energy $k_B T$ applied to the other surface 14 of the magnet 10 is increased to 1.5 J. The other parameters and conditions and the like are the same as those of the first embodiment. Similar to (E) of FIG. 2, (C) of FIG. 9 shows a coordinate system (a right-handed system) of the coordinates of the magnetic moment n.

In (A) of FIG. 9, at the time t=300(1/J), the black spot is present in the central portion of the skyrmion 40, and the magnetic moment in the negative z direction is still present. (B) of FIG. 9 shows that at the time t=500 (1/J), the magnetic moment in the center of the skyrmion 40 in the negative z direction disappears, and the skyrmion 40 cannot be maintained.

Next, a time dependence of heat energy application for eliminating the skyrmion will be described. In a case of the application for the time of 150 (1/J)≤t≤200 (1/J), the skyrmion 40 can be eliminated. However, the skyrmion is created if the application time of the local heat energy is either longer or shorter than the above-described range. As the above, by the laser application during a period of t=150 to 200 (1/J) in a case where the local heat energy is 1.5 J, the skyrmion 40 can be eliminated at t=500 (1/J). Further, a time dependence of heat energy application for eliminating the skyrmion in a case where the local heat energy $k_B T$ is 2.0 J. In a case of the application time of 200 (1/J)≤t≤250 (1/J), the skyrmion 40 can be eliminated. The skyrmion 40 is created if the application time of the local heat energy is either longer or shorter than the above-described range.

[Third Embodiment]

Figure 10:
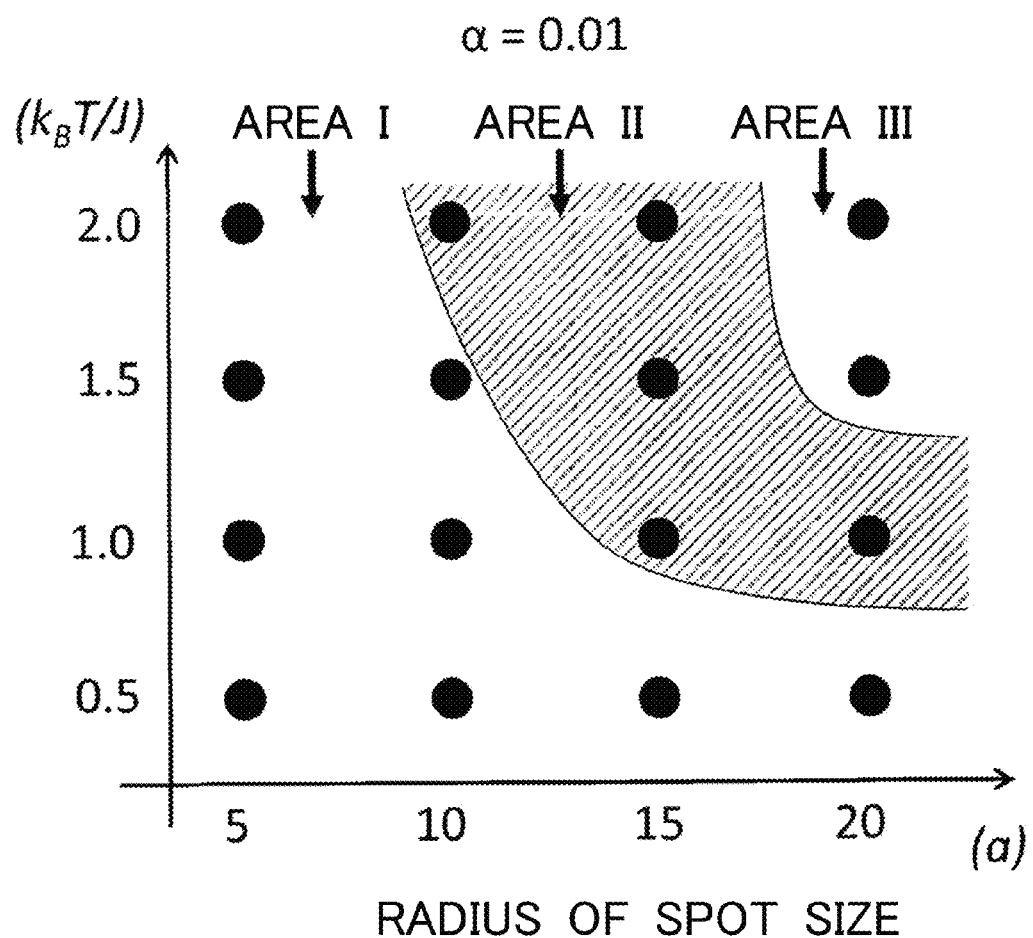
FIG. 10 is a drawing showing a dependence between local heat energy (vertical axis) and a radius of spot size of the local heat energy (horizontal axis) for the creation or elimination of the skyrmion 40 according to a third embodiment.

FIG. 10 is a drawing showing a dependence between the local heat energy (vertical axis) and the radius of spot size of the local heat energy (horizontal axis) in the creation or the elimination of the skyrmion 40 according to the third embodiment. The vertical axis indicates values where the $k_B T$ being the local heat energy is standardized by the dimension J of the magnetic exchange interaction. The horizontal axis indicates values where the radius of spot size of the local heat energy applied to the other surface 14 of the magnet 10 is standardized by the lattice constant a (angstrom) of the chiral magnet. In the third embodiment, the other parameters and conditions are the same as those of the first embodiment, except that the local heat energy and the radius of spot size of the local heat energy are changed.

The area I in FIG. 10 indicates a condition of the local heat energy under which the skyrmion 40 can neither be created nor eliminated. The area II indicates a condition of the local heat energy under which the single skyrmion 40 can be created. The area III indicates a condition of the local heat energy under which the skyrmion 40 can be eliminated. However, the time dependence of heat energy application for eliminating the skyrmion exists. In a case where the local heat energy $k_B T$=1.5 J, if the application time is 150 (1/J)≤t≤200 (1/J) and if the local heat energy $k_B T$=2.0 J, the application time is 200 (1/J)≤t≤250 (1/J).

According to FIG. 10, the conditions for the spot size of the local heat energy and the heat energy to eliminate the skyrmion 40 can be seen. That is, the elimination of the skyrmion becomes possible if the application of the heat energy is stronger or the spot size is larger than those for the skyrmion creation. It can be said that as the conditions of the local heat energy when eliminating the skyrmion 40, it may be sufficient if at least either one of the followings is satisfied: that the heat energy for eliminating of the skyrmion 40 is larger than the heat energy when creating the skyrmion 40, and that the radius of spot size is larger than the radius of spot size of the heat energy when creating the skyrmion 40 on the other surface 14 of the magnet 10.

As one example, when eliminating the skyrmion 40, both of the local heat energy and the radius of spot size may be larger than those when creating the skyrmion 40. Also, as the radius of spot size is fixed to 20a, the local heat energy when creating the skyrmion 40 may be set as $k_B T$=1.0 J and the local heat energy when eliminating the skyrmion 40 may be set as $k_B T$=1.5 J. That is, in a case where the radius of spot size is fixed, the local heat energy when eliminating the skyrmion 40 may be set larger than the local heat energy when creating the skyrmion 40.

According to FIG. 10, the diameter of the skyrmion 40 is twice as large as the radius of spot size of the local heat energy. It can be said that in a case where the diameter $\lambda$ of the skyrmion 40 is 60 a, it is appropriate for the creation of the skyrmion 40 if the diameter of the spot size of the local heat energy is approximately ½ of the diameter size of the skyrmion. Also, in a case where the radius of spot size of the local heat energy is no less than 20a, the created skyrmion 40 can be eliminated if using the local heat energy where $k_B T$ is no less than 1.5 J.

[Fourth Embodiment]

FIG. 11 is a drawing showing a dependence between the local heat energy (vertical axis) and the radius of spot size of the local heat energy (horizontal axis) of types of skyrmion which can be created according to the fourth embodiment. The vertical axis and horizontal axis are similar to FIG. 10. (A), (B), and (C) of FIG. 11 respectively show the conditions for the skyrmion creation in a case where the Gilbert damping constant a is 0.05, 0.1, and 1. In the fourth embodiment, the other parameters and conditions are the same as those of the first embodiment.

The areas I in (A), (B), and (C) of FIG. 11 indicate the conditions of the local heat energy by which the skyrmion 40 can neither be created nor eliminated. The areas II of (A), (B), and (C) of FIG. 11 indicate the conditions under which the single skyrmion 40 can exist. The area IV indicates a condition with a magnetic texture different from that of the area II. In a case where the magnet is in the metastable ferromagnetic state and the Gilbert damping constant $\alpha$ is 0.05≥α≥0.01, if d≥15a and $k_B T$≥J where d indicates the radius of spot size of the local heat and T indicates the heat energy temperature, the skyrmion can be created. Also, the skyrmion can be eliminated if d≥18a and $k_B T$≥1.5*J. The lower limit values of the spot size and the heating energy for eliminating the skyrmion are larger than the lower limit values of the spot size and the heating energy for creating the skyrmion.

If $0.01<\alpha<0.05$, the range of the area III of FIG. 10 provides the condition under which the skyrmion 40 can be eliminated. If $0.01<\alpha<0.05$, the range of the area III of FIG. 10 continuously changes and does not become narrow compared to the range of the area III of FIG. 10 under the condition where $\alpha=0.01$.

(A) and (B) of FIG. 12 are the drawings showing magnetic textures in the areas IV of FIG. 11, the magnetic textures different from the single skyrmion 40. (C) of FIG. 12 is a drawing showing a magnetic texture in the area IV of FIG. 11, which is with two skyrmions 40. (A), (B), and (C) of FIG. 12 shows magnetic textures, which are called as skyrmionium, di-skyrmionium, and two skyrmions in this order.

[Fifth Embodiment]

FIG. 13 is a drawing showing a dependence between the local heat energy (vertical axis) and the radius of spot size of the local heat energy (horizontal axis) for the creation or elimination of the skyrmion 40 according to the fifth embodiment. The vertical axis and the horizontal axis are similar to FIG. 10 and FIG. 11. In the present example, when the external magnetic field [Equation 5]=0.02J and the chiral magnet is not in the metastable ferromagnetic state but in the ferromagnetic state, the skyrmion 40 is created by applying the local heat energy to the other surface 14 of the chiral magnet. The above-mentioned matter is different from the first to the fourth embodiments.

In FIG. 13, the Gilbert damping constant $\alpha=0.01$. The area I indicates the condition of the local heat energy under which the skyrmion 40 can neither be created nor eliminated. The area II indicates the condition of the local heat energy under which the single skyrmion 40 can be created. The area III indicates the condition of the local heat energy under which the skyrmion 40 can be eliminated. In the area III, there is no time dependence of heat energy application. Either a short-time application condition or a long-time application condition may be a condition for eliminating the skyrmion. The skyrmion 40 cannot be created under this elimination condition.

[Sixth Embodiment]

(A), (B), and (C) of FIG. 14 are the drawings showing dependences between the local heat energy (vertical axis) and the radius of spot size of the local heat energy (horizontal axis) in the creation of the skyrmion 40 according to the sixth embodiment. The Gilbert damping constants are respectively: $\alpha=0.05$, $\alpha=0.1$, and $\alpha=1$ in (A), (B), and (C) of FIG. 14. In the sixth embodiment, the other parameters and conditions are the same as those of the fifth embodiment.

The areas I and areas II of (A), (B), and (C) of FIG. 14 are similar to those of FIG. 13. The area V of (A) of FIG. 14 indicates a condition of the local heat energy under which a plurality of skyrmions can be created. The skyrmion structure which can be created in the area V is not the magnetic texture such as the skyrmionium or the di-skyrmionium in the above-described area IV. In a case where the magnet is in the ferromagnetic state and the Gilbert damping constant $\alpha$ is: $0.05 \geq \alpha \geq 0.01$, the skyrmion can be created if $d \geq 15a$ and $k_B T \geq 1.5*J$, where d indicates the radius of spot size of the local heat and T indicates the heat energy temperature. Also, the skyrmion can be eliminated if $d \geq 20a$ and $k_B T \geq 1.5*J$. The lower limit value of the spot size with which the skyrmion can be eliminated is larger than the lower limit value of the spot size with which the skyrmion can be created. If $0.01<\alpha<0.05$, the range of the area III of FIG. 13 provides the condition under which the skyrmion 40 can be eliminated. If $0.01<\alpha<0.05$, the range of the area III of FIG. 13 continuously changes and does not become narrow compared to the range of the area III of FIG. 13 under the condition where $\alpha=0.01$.

As the above, as shown in the first to the sixth embodiments, as the method for creating and eliminating the single skyrmion 40, it is sufficient if the local heat energy is applied to the magnet 10 which is in the ferromagnetic state or the metastable ferromagnetic state. The size of the single skyrmion 40 is from 1 nm to 100 nm. On the other hand, in a case of a phase change type storage media or a phase change memory using a conventional DVD, the size is approximately several hundreds of nanometers (nm) per unit memory capacity.

In a case of the phase change type storage media, even if shortening the optical wavelength to be less than several hundreds of nanometers, the feature of the shortened optical wavelength cannot be utilized. Because the limitation of the size of the phase change type storage media is several hundreds of nanometers, a mechanism which phase changes between the crystal phase and the amorphous phase is maintained, while maintaining a boundary between the crystal phase and the amorphous phase. On the other hand, in a case of using the skyrmion 40, as shortening the optical wavelength, it is sufficient if the magnet 10 in which the size of the skyrmion 40 is small by that is selected and used. That is, in the magnet 10 for creating and eliminating the skyrmion 40, the size of the memory unit can be set smaller in response to the diameter or the size of the heat energy to be applied. For example, if using the optical antenna 50, the diameter for applying the heat energy, even if using the existing laser beam 60, can be further miniaturized than the diameter of the laser beam 60. The feature of the skyrmion 40 further generates the effect. If using the current LSI manufacturing process, the diameter of the tip 57 of the heating needle 55 can be set as several nanometers. For this reason, the magnet 10 having the diameter $\lambda$ of the skyrmion 40 of several nanometers can be used in the magnetic storage media 30. In this way, the density for creating the skyrmion 40 in the magnet 10 can be further improved. In a case of the phase change memory, a resistance change is used as the memory, the resistance change between the crystal phase and the amorphous phase of the material such as chalcogenide alloy, germanium antimony telluride (GeSbTe) and the like, by applying voltages to an electrode on an insulating film and using the Joule heat by a resistance of the insulating film. In this case, the heating spot size is determined by the size of the electrode. A length of one side of the electrode may be twice as long as the spot size used here.

Also, if the local heat energy is set in an appropriate size, the created skyrmion 40 can be eliminated. The time t=3000 (1/J) corresponds to approximately 1 nanosecond (ns). Therefore, the time for creating or eliminating of the skyrmion 40 is no more than 0.2 nanoseconds (ns), and is an ultra-short pulse compared to a phase change time approximately 30 nanoseconds in the conventional phase change type storage media or memory. For this reason, high-speed writing and high-speed erasing are possible, and a storage media and memory with a large memory capacity can be provided.

Also, the present specification provides an optimal design guideline for the magnetic storage media 30 and the skyrmion memory 410 which are capable of creating and eliminating the skyrmion 40. The design guideline is shown by the state drawings (FIGS. 10, 11, 13, and 14) described by using the local heat energy (vertical axis) and the radius of spot size of the local heat energy (horizontal axis). In this way, since each type of magnetic materials can also be provided with the shared design guideline, it is expected to lead a large impact on a practical application of an ultra-high-speed and large memory utilizing the magnetic storage media 30 and the skyrmion memory 410 which use the skyrmion 40.

The data storage devices 100, 200 and 300 and the skyrmion memory 410 which use the skyrmion 40 can perform writing and erasing any number of times. That is, there is no limitation for the number of times of the writing and erasing, and the endurance (durability) is infinite. Also, since the skyrmion 40 exists stably, the data retention (holding) performance of the data storage device 100 and the like and the skyrmion memory 410, which use the skyrmion 40 for units of data storage, can be significantly improved. In a case of a nanosize magnet generally independent, an inversion of its magnetic moment occurs by a thermal disturbance from the outside. For that reason, in a case where the magnetic moment is handled as storage information, miniaturization of the magnet to a nanosize level has been a serious obstacle. Even if the magnet 10 in the data storage device 100 and the like and the skyrmion memory 410 is set in a nanosize, the limitation of such a thermal disturbance can be overcome. The reason is because that the magnet 10 has a stable magnetic field generating unit 20 in the lower portion. This magnetic field generating unit 20 continues holding a magnetic moment which is ferromagnetic and stable without being influenced by the thermal disturbance because it is a magnet which is not in a nanosize but is large and two-dimensionally extended in the lower portion of the magnet 10. Due to the magnetic field generated from the magnetic field generating unit 20, an inversion of the magnetic moment of the skyrmion 40 does not occur by the thermal disturbance by the outside environment. This is the reason why the data retention (holding) performance of the data storage device 100 and the like and the skyrmion memory 410 can be significantly improved.

FIG. 15 and the FIG. 16 are the drawings showing examples of shapes of the first electrode 82 in a case of viewing from the x-y plane. The first electrode 82 is in contact with the first insulator 92 over the magnet 10. The first electrode 82 is arranged in the first insulator 92 in a case of viewing from the x-y plane.

In an example of FIG. 15, the first electrode 82 has a square or rectangle shape. In a planar shape of the first electrode 82 (the magnetic metal 83) on a contact surface with the insulator 92, a length D of one side of the rectangle may be twice as long as the radius d of spot size. The first electrode 82 may have a triangle shape. The triangle may be an equilateral triangle, a right-angled triangle, or an isosceles triangle. Also, the first electrode 82 may have an oval or elliptical shape. Also, the first electrode 82 may have a parallelogram shape. The parallelogram may be a rhombus shape. Also, the first electrode 82 may have a trapezoid shape. In an example of FIG. 16, the first electrode 82 has a circular shape. The first electrode 82 of FIG. 16 corresponds to the first electrode 82 of FIG. 6. In a planar shape of the magnetic metal 83 on the contact surface with the insulator 92, the length D of the diameter of the circle may be twice as long as the radius d of spot size.

The shape of the first electrode 82 on the x-y plane is not limited in the above-described example. Even if the shape is similar to those of the plurality of the above-described examples, the shape may be a shape combining those of the above-described plurality of examples. The conclusions for the embodiments of the magnet 10 having been described above are the same even if they are the structures qualitatively laminating the magnet 10.

FIG. 17 is a drawing showing a cross section of the skyrmion memory device 500. The skyrmion memory device 500 is a device including at least one skyrmion memory 410. The ammeter 91 of FIG. 6 is omitted in FIG. 17. The skyrmion memory device 500 includes a magnetic field generating unit 20 which is a ferromagnet layer, and a skyrmion memory unit layer 110 which is formed over the magnetic field generating unit 20. Also, the skyrmion memory device 500 includes an insulator 94 between the skyrmion memory unit layer 110 and the magnetic field generating unit 20.

The skyrmion memory unit layer 110 of the present example has a memory layer 160, a first wiring layer 170, and a second wiring layer 175, the memory layer 160, the first wiring layer 170, and the second wiring layer 175 laminated upward in this order. The insulator 94 is positioned between the skyrmion memory unit layer 110 and the magnetic field generating unit 20. The memory layer 160, the insulator 94, and the magnetic field generating unit 20 correspond to the skyrmion memory 410 of FIG. 6. Black dots in first and third magnetic bodies 10 from the left side indicate states where the skyrmion 40 is created.

The first wiring layer 170 has a first wiring 171, a first wiring protection film 172, and a via 173. The first wiring protection film 172 serves as an insulating film between layers for insulating the first wiring 171. The first wiring 171 supplies currents for creating, eliminating, and detecting the skyrmion 40 to the first electrode 82.

The second wiring layer 175 has a second wiring 176 and a second wiring protection film 177. The second wiring 176 is connected to the via 173. The second wiring protection film 177 serves as an insulating film between layers for insulating the second wiring 176.

FIG. 18 is a drawing showing a cross-section of the skyrmion memory device 500 embedding the skyrmion memory 410 and the CMOS-FET 130. The skyrmion memory device 500 includes the skyrmion memory 410 and CMOS-FET (Field Effect Transistor, field effect transistor) 130. The skyrmion memory 410 is formed in an area, where the CMOS-FET 130 does not exist, in a silicon substrate.

The CMOS-FET 130 is a general CMOS-FET which is formed by a general silicon process. The CMOS-FET 130 in the present example has two-layer Cu wiring layers. Also, the CMOS-FET 130 has an NMOS-FET 132 formed in a p-type well and a PMOS-FET 133 formed in an N-type well.

FIG. 19 is the drawing showing a cross section of the skyrmion memory device 500 in which n layers of skyrmion memory unit layers 110 are laminated. For the skyrmion memory device 500 of the present example, n may be 5. The magnetic field generating unit 20 has a film thickness of 3000 angstrom. The skyrmion memory unit layer 110 has a structure in which a skyrmion memory unit layer 110-1 to a skyrmion memory unit layer 110-n are laminated. The skyrmion memory device 500 of the present example has a total film thickness of approximately 15,000 angstrom.

FIG. 20 is a drawing showing a cross section of the skyrmion memory device 500 having a plurality of magnetic field generating units 20. The skyrmion memory device 500 of the present example has totally 6 layers of skyrmion memory unit layers 110 from a skyrmion memory unit layer 110-1 to a skyrmion memory unit layer 110-6. The skyrmion memory device 500 has three layers of skyrmion memory unit layers 110 on the magnetic field generating unit 20-1. The skyrmion memory device 500 further has a magnetic field generating unit 20-2 between the skyrmion memory unit layer 110-3 to the skyrmion memory unit layer 110-4. In this way, the skyrmion memory unit layer 110 can keep the intensity of the magnetic field constant in a lamination direction of the skyrmion memory unit layer 110, the magnetic field received by the magnet 10 in the skyrmion memory unit layer 110 from the magnetic field generating unit 20. The magnetic field generating unit 20 may be arranged at an appropriate interval in response to the materials of the skyrmion memory unit layer 110 and the like.

FIG. 21 is a drawing showing a cross section of the skyrmion memory device 500 embedding the skyrmion memory 410 on an upper layer of the CMOS-FET 130. The skyrmion memory device 500 includes the skyrmion memory 410 and the CMOS-FET 130 configured with a CPU (Central Processing Unit) function. The skyrmion memory 410 is formed on the CMOS-FET 130. The CMOS-FET 130 of the present example has an NMOS-FET 132 formed on a P-type well and a PMOS-FET 133 formed on an N-type well.

The skyrmion memory device 500 can have, in the same chip, the CMOS-FET 130 configured with the CPU function and the skyrmion memory 410 being a laminated large non-volatile memory. As this result, a reduction and speeding up of the CPU processing time can be achieved and the power consumption of the CPU can be significantly decreased. That is, the processing time, for example, for calling from the HD such as a basic OS when starting a PC, writing and reading to an external SRAM or DRAM and the like can be significantly shortened, contributing for the reduction of the CPU time (significant speeding up). As this result, a CPU with significant low power consumption can be achieved. Further, the power consumption of the skyrmion memory 410, which is a large non-volatile memory, for holding the memory is zero. Since the direction of the magnetic moment of the skyrmion has a topological stability, any power supply from the outside is not required at all. Since data refresh is necessary for the DRAM memory and SRAM is volatile, a continuous power application is necessary. The flash memory cannot directly exchange data with the CPU since the data access time is long.

FIG. 22 is a drawing showing a writing circuit and an erasure circuit of the skyrmion memory device 500. In the present specification, that writing data on the skyrmion memory 410 refers to that creating the skyrmion 40 in the magnet 10 of the skyrmion memory 410. Also, in the present specification, that erasing data from the skyrmion memory 410 refers to that eliminating the skyrmion 40 in the skyrmion memory 410.

Although the magnetic field generating unit 20 is not shown in FIG. 22, the skyrmion memory 410 may have a configuration similar to the configuration of FIG. 6.

A plurality of the skyrmion memories 410 are connected to skyrmion selection lines 135 and bit lines 136. For example, the skyrmion selection lines 135 (n) are respectively connected to n rows of skyrmion memories 410, and the bit lines 136 (n) are respectively connected to n columns of skyrmion memories 410. Each skyrmion selection line 135 and each bit line 136 connected to the skyrmion memory 410 are respectively connected to one FET 139. The FET 139 serves as an electrical switch selecting individual skyrmion memory 410 by applying voltages to a gate of the FET 139.

For example, in a case where the skyrmions 40 are created in the skyrmion memories 410 (n, n), the FET 139 connected to one pair of skyrmion selection line 135 (n) and bit line 136 (n) is respectively turned on. The bit lines 136 are electrically connected to a power source 81 on the high potential side, and the skyrmion selection lines 135 are electrically connected to the power source 81 on the low potential side. Also, the bit lines 136 are electrically connected to the first electrode 82 of the skyrmion memory 410, and the skyrmion selection lines 135 are electrically connected to the second electrode 84 of the skyrmion memory 410. As a current pulse flows from the first electrode 82 toward the second electrode 84, since the insulating film on the magnet is high-resistance, the Joule heat is generated. The heat-generating area is an area of the first electrode 82. This pulse heat energy refers to that the heat energy is applied in a pulse pattern to the magnet 10, the skyrmion 40 can be created in the magnet 10 of the skyrmion memories 410 (n, n). Arrows in FIG. 22 indicate the flowing direction of the currents. The currents flow to the ground from the bit lines 136 (n) through the skyrmion memories 410 (n, n) and the skyrmion selection lines 135.

The skyrmion memory device 500 can also eliminate the data of the skyrmion memory 410 by adjusting the size of the power source 81. For example, the data of the skyrmion memory 410 can be eliminated by applying the current larger than that when creating the skyrmion 40, providing heat energy larger that when creating the skyrmion 40. A detailed condition for eliminating may follow the conditions described in FIG. 7 to FIG. 14. The power source 81 can apply, to the magnet 10 in a pulse pattern, the current higher than when creating resulting from that the FET 139 of one pair of skyrmion selection line 135 and bit line 136 is turned on. The adjustment of the voltage value of the power source 81 may be performed by the CMOS-FET 130 and the like.

Between two FETs 139 connected to one skyrmion selection line 135 in parallel, the FET 139 which is connected to a read line 137 is called the FET 139 of the read line 137, and the other FET 139 which is not connected to the read line 137 is called the FET 139 of the skyrmion selection line 135. The read line 137 is electrically connected to at least one of the plurality of skyrmion memories 410 via the skyrmion selection lines 135. In a case of writing and erasing, the FET 139 connected to the read line 137 is set to an OFF state.

FIG. 23 is a drawing showing one example of the detection circuit 138 of the skyrmion memory device 500. The skyrmion memory device 500 includes one detection circuit 138 connected to a plurality of read lines 137. The detection circuit 138 of the present example may correspond to the ammeter 91 of FIG. 6. In the present specification, that reading data of the skyrmion memory 410 refers to that detecting the presence of the skyrmion 40 in the magnet 10 of the skyrmion memory 410.

For example, in a case of detecting the presence or absence of the skyrmion 40 in the skyrmion memories 410 (n, n), the skyrmion memory device 500 sets the FET 139 of the bit line 136 (n) in an ON state to cause the currents for skyrmion detection to flow from the bit line 136 toward the first electrode 82.

Also, the skyrmion memory device 500 detects the skyrmion 40 by setting the FET 139 of the skyrmion selection line 135 in the OFF state and the FET 139 of the read line 137 in the ON state and causing the currents to flow from the second electrode 84 through the read line 137 to the detection circuit 138.

The detection circuit 138 amplifies the currents flowing to the read line 137 and detects the presence or absence of the skyrmion 40. The detection circuit 138 includes a feedback resistance Rf, an amplification circuit C1, and a voltage comparison circuit C2. The currents input to the detection circuit 138 from the read line 137 enter into the current-voltage converter circuit C1. The current-voltage converter circuit C1 converts the currents from the read line 137 into the voltage and amplifies the same. The voltage comparison circuit C2 includes two inputs of an output voltage and a reference voltage Vref of the current-voltage converter circuit C1. In a case where the output voltage of the amplification circuit C1 is larger than the reference voltage Vref, the voltage comparison circuit C2 outputs "1". On the other hand, in a case where the output voltage of the amplification circuit C1 is smaller than the reference voltage Vref, the voltage comparison circuit C2 outputs "0".

Also, in a case of detecting the presence or absence of the skyrmion 40 in the skyrmion memories 410 (n−1, n+1), first, the FET 139 connected to the bit line 136 (n+1) and the read line 137 (n−1) is turned on. In this way, the detection circuit 138 connected to the read line 137 (n−1) detects the tunnel current. In this way, one detection circuit 138 is sufficient.

In response to the presence of the skyrmion 40, data of "1" or "0" can be obtained. That is, the data reading in response to the presence or absence of the skyrmion 40 becomes possible.

As the above, the skyrmion memory device 500 can select any skyrmion memory 410 to create, eliminate, and detect the skyrmion 40. The FET 139 and the detection circuit 138 arranged in the periphery of the skyrmion memory 410 may be configured with the CMOS device. In the skyrmion memory device 500, the plurality of skyrmion memories 410 may be in a planar array, and the skyrmion memories 410 in the planar array may be further laminated.

FIG. 24 is a drawing showing a configuration example of a skyrmion memory embedded central computational processing device 600. In the skyrmion memory embedded central computational processing device 600, a skyrmion memory device 500 and a central computational processing device 610 are formed in the same chip. FIG. 21 shows its cross-section drawing. The skyrmion memory device 500 is the above-mentioned skyrmion memory device 500. The central computational processing device 610 is, for example, a CMOS-LSI device formed on a Si substrate. The central computational processing device 610 has functions of writing each type of operation processing data and data base to the skyrmion memory device 500, and reading data processing basic soft programs or each type of data from the skyrmion memory device 500.

FIG. 25 shows a skyrmion memory device 500 and an input/output device 710. The data storage device 700 is a memory device such as a HD replacing memory device, USB memory, or SD card and the like. The skyrmion memory device 500 is the above-mentioned skyrmion memory device 500. The input/output device 710 has at least one of a function of writing data from the outside to the skyrmion memory device 500 and a function of reading data from the skyrmion memory device 500 and outputting to the outside.

FIG. 26 shows a configuration example of a data processing apparatus 800. The data processing apparatus 800 includes a skyrmion memory device 500 and a processor 810. The skyrmion memory device 500 is the above-mentioned skyrmion memory device 500. The processor 810 has a digital circuit of processing digital signals, for example. The processor 810 has at least one of the functions of writing data to the skyrmion memory device 500 and reading data from the skyrmion memory device 500.

FIG. 27 shows a configuration example of the data communication apparatus 900. The communication apparatus 900 refers to general devices having communication functions with the outside, such as a mobile phone, a smart phone, a tablet-type terminal and the like. The communication apparatus 900 may be portable or may be non-portable. The communication apparatus 900 includes a skyrmion memory device 500 and a communication unit 910. The skyrmion memory device 500 is the above-mentioned skyrmion memory device 500. The communication unit 910 has communication functions with the outside of the communication apparatus 900. The communication unit 910 may have a wireless communication function, may have a wired communication function, or may have both of the wireless communication and wired communication functions. The communication unit 910 has at least one of the function of writing data received from the outside to the skyrmion memory device 500, the function of sending data read from the skyrmion memory device 500 to the outside, and the function performed based on control information stored by the skyrmion memory device 500.

As the above, the skyrmion memory device 500, the skyrmion memory embedded central computational processing device 600, the data storage device 700, the data processing apparatus 800, and the communication apparatus 900, which are capable of creating, eliminating, and detecting the skyrmion 40 at high speed and low power consumption, can be provided.

INDUSTRIAL APPLICABILITY

The skyrmion 40 is an ultrafine structure in a nanoscale size with a diameter of 1-100 nm, and can be applied as a large magnetic storage media which can extremely miniaturize a huge amount of bit information. The skyrmion memory can thermally perform the writing. Then, the time required for this writing is also several hundreds of picosecond. By using such an ultra-high-speed and large writable and erasable magnetic storage media 30, the large magnetic storage performance used for image storage of movies and televisions can be significantly improved.

EXPLANATION OF REFERENCES

10 . . . magnet, 12 . . . a surface, 14 . . . another surface, 20 . . . magnetic field generating unit, 30 . . . magnetic storage media, 40 . . . skyrmion, 50 . . . optical antenna, 55 . . . heating needle, 57 . . . tip, 60 . . . laser beam, 70 . . . laser light source, 80 . . . heating device, 81 . . . power source, 82 . . . first electrode, 83 . . . magnetic metal, 84 . . . second electrode, 87 . . . terminal on the other end, 91 . . . ammeter, 92 . . . insulator, 94 . . . insulator, 100 . . . data storage device, 110 . . . skyrmion memory unit layer, 130 . . . CMOS-FET, 132 . . . NMOS-FET, 133 . . . PMOS-FET, 135 skyrmion selection line, 136 . . . bit line, 137 . . . read line, 138 . . . detection circuit, 139 . . . FET, 160 . . . memory layer, 170 . . . first wiring layer, 171 . . . first wiring, 172 . . . first wiring protection film, 173 . . . via, 175 . . . second wiring layer, 176 . . . second wiring, 177 . . . second wiring protection film, 200 . . . data storage device, 300 . . . data storage device, 410 . . . skyrmion memory, 500 skyrmion memory device, 600 . . . skyrmion memory embedded central computational processing device, 610 . . . central computational processing device, 700 . . . data storage device, 710 . . . input/output device, 800 . . . data processing apparatus, 810 . . . processor, 900 . . . communication apparatus, 910 . . . communication unit

What is claimed is:

1. A magnetic storage media, comprising:
a thin layer magnet; and
a magnetic field generating unit that is arranged facing a surface of the magnet and sets the magnet in a metastable ferromagnetic state or a ferromagnetic state; wherein
a skyrmion can be created or eliminated in the magnet by locally applying heat energy to another surface of the magnet, the other surface positioned on an opposite side of the surface of the magnet,
with respect to a diameter $\lambda$ of the skyrmion created in the thin layer magnet, a plane size of the thin layer magnet has a size of $W_m > \lambda/2$ and $h_m > \lambda/2$, where $W_m$ indicates a width of the plane and $h_m$ indicates a height of the plane, and
when a Gilbert damping constant $\alpha$ is $0.05 > \alpha \geq 0.01$, the skyrmion is created or eliminated by locally applying the heat energy, with which $d \geq 15a$ and $k_B T \geq 1.0*J$ are satisfied, where a indicates a lattice constant of the magnet, J indicates a dimension of a magnetic exchange interaction of the magnet, $k_B$ indicates a Boltzmann constant, d indicates a radius of spot size of local heat, and T indicates a temperature of the magnet in a position to which the heat energy is applied.

2. The magnetic storage media according to claim 1, wherein
the magnetic field generating unit generates a magnetic field corresponding to a skyrmion crystal phase of the magnet, the magnetic field setting the magnet in the metastable ferromagnetic state.

3. The magnetic storage media according to claim 2, wherein the skyrmion is created in the magnet by locally applying the heat energy, with which $d \geq 15a$ and $k_B T \geq 1.0*J$ are satisfied, to the other surface of the magnet that is in the metastable ferromagnetic state.

4. The magnetic storage media according to claim 2, wherein the skyrmion is eliminated in the magnet by locally applying the heat energy, with which $d \geq 18a$ and $k_B T \geq 1.5*J$ are satisfied, to the other surface of the magnet that is in the metastable ferromagnetic state.

5. The magnetic storage media according to claim 1, wherein the magnetic field generating unit sets the magnet in the ferromagnetic state.

6. The magnetic storage media according to claim 5, wherein the skyrmion is created in the magnet by locally applying the heat energy, with which $d \geq 15a$ and $k_B T 1.5*J$ are satisfied, to the other surface of the magnet that is in the ferromagnetic state.

7. The magnetic storage media according to claim 5, wherein the skyrmion is eliminated in the magnet by locally applying the heat energy, with which $d \geq 20a$ and $k_B T \geq 1.5*J$ are satisfied, to the other surface of the magnet that is in the ferromagnetic state.

8. A magnetic storage media, comprising:
a thin layer magnet and
a magnetic field generating unit that is arranged facing a surface of the magnet and generates a magnetic field corresponding to a skyrmion crystal phase of the magnet, the magnetic field setting the magnet in a metastable ferromagnetic state, wherein
a skyrmion can be created or eliminated by applying heat energy to another surface of the magnet, the other surface positioned on an opposite side of the surface of the magnet,
with respect to a diameter $\lambda$ of the skyrmion created in the thin layer magnet, a plane size of the thin layer magnet has a size of $W_m > \lambda/2$ and $h_m > \lambda/2$, where $W_m$ indicates a width of the plane and $h_m$ indicates a height of the plane, and
the skyrmion is eliminated in the magnet by locally applying the heat energy to the other surface of the magnet that is in the metastable ferromagnetic state for an application time satisfying $200 (1/J) \geq t \geq 150 (1/J)$ when heat energy $k_B T$ in the magnet is $2.0J > k_B T 1.5J$ and for the application time satisfying $250 (1/J) \geq t \geq 200 (1/J)$ when $k_B T$ 2.0J, where J indicates a dimension of a magnetic exchange interaction of the magnet, $k_B$ indicates a Boltzmann constant, and T indicates a temperature of the magnet in a position to which the heat energy is applied.

9. A skyrmion memory, comprising:
a magnetic storage media, including
a thin layer magnet, and
a magnetic field generating unit arranged facing a surface of the magnet, wherein
a skyrmion can be created or eliminated by applying heat energy to another surface of the magnet, the other surface positioned on an opposite side of the surface of the magnet;
a first electrode having an insulator arranged in contact with an upper portion of the other surface of the magnet and a magnetic metal arranged in contact with an upper portion of the insulator; and
a second electrode including a metal arranged in contact with a lower portion of the surface, wherein
a voltage is applied to the first electrode and the second electrode,
Joule heat generated by causing a current to flow through the insulator is applied to the magnet,
a skyrmion is created or eliminated in the magnet, and
a skyrmion is detected by a tunnel current flowing through the insulator.

10. The skyrmion memory according to claim 9, wherein a length D of one side of a rectangle or a diameter of a circle in a planar shape of the first electrode in a contact surface contacting with the insulator is twice as long as a radius d of spot size of local heat when the heat energy is locally applied.

11. A skyrmion memory device, comprising:
a plurality of skyrmion memories which are configured with the skyrmion memory according to claim 9 as one memory unit memory;
a bit line which is electrically connected to at least one of the plurality of skyrmion memories;
a selection line which is electrically connected to at least one of the plurality of skyrmion memories;
a read line which is electrically connected to at least one of the plurality of skyrmion memories;
a plurality of field-effect transistors which are respectively connected to each of the bit line, the selection line, and the read line, and select at least one of the plurality of skyrmion memories; and
a detection circuit which amplifies a current flowing through the read line and detects presence or absence of the skyrmion.

12. A skyrmion memory embedded central computational processing device, wherein the skyrmion memory device according to claim 11 and the central computational processing device are formed in the same chip.

13. A data storage device embedding the skyrmion memory device according to claim 11.

14. A data processing apparatus embedding the skyrmion memory device according to claim 11.

15. A data communication apparatus embedding the skyrmion memory device according to claim 11.

* * * * *